US008785213B2

(12) United States Patent
Oh et al.

(10) Patent No.: US 8,785,213 B2
(45) Date of Patent: Jul. 22, 2014

(54) METHOD OF FABRICATING NON-VOLATILE MEMORY DEVICE HAVING SMALL CONTACT AND RELATED DEVICES

(75) Inventors: Gyu-Hwan Oh, Hwaseong-si (KR); Doo-Hwan Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 221 days.

(21) Appl. No.: 13/494,206

(22) Filed: Jun. 12, 2012

(65) Prior Publication Data

US 2013/0102150 A1 Apr. 25, 2013

(30) Foreign Application Priority Data

Oct. 19, 2011 (KR) .................. 10-2011-0107159

(51) Int. Cl.
*H01L 21/00* (2006.01)
(52) U.S. Cl.
USPC .................. 438/3; 438/667; 257/E45.004
(58) Field of Classification Search
None
See application file for complete search history.

(56) References Cited

U.S. PATENT DOCUMENTS

| 6,429,064 | B1 * | 8/2002 | Wicker | 438/238 |
|---|---|---|---|---|
| 7,229,887 | B2 * | 6/2007 | Dennison | 438/387 |
| 7,465,675 | B2 * | 12/2008 | Koh | 438/758 |
| 7,824,954 | B2 | 11/2010 | An et al. | |
| 7,906,773 | B2 * | 3/2011 | Ko et al. | 257/2 |
| 8,021,966 | B2 * | 9/2011 | Jeong et al. | 438/482 |
| 8,030,129 | B2 * | 10/2011 | Jeong et al. | 438/102 |
| 8,105,867 | B2 * | 1/2012 | Matamis et al. | 438/95 |
| 8,468,692 | B2 * | 6/2013 | Kim | 29/846 |
| 8,501,623 | B2 * | 8/2013 | Oh et al. | 438/675 |
| 8,507,353 | B2 * | 8/2013 | Oh et al. | 438/382 |
| 2007/0272950 | A1 * | 11/2007 | Kim et al. | 257/211 |
| 2009/0017577 | A1 | 1/2009 | An et al. | |
| 2009/0280599 | A1 * | 11/2009 | Im et al. | 438/102 |
| 2010/0327251 | A1 * | 12/2010 | Park | 257/2 |
| 2011/0044098 | A1 * | 2/2011 | An et al. | 365/163 |
| 2011/0248235 | A1 * | 10/2011 | Jeong et al. | 257/2 |
| 2012/0119181 | A1 * | 5/2012 | Oh et al. | 257/4 |
| 2012/0256151 | A1 * | 10/2012 | Liu et al. | 257/2 |

FOREIGN PATENT DOCUMENTS

| JP | 2009-21602 | 1/2009 |
|---|---|---|
| KR | 10-2009-0006628 | 1/2009 |
| KR | 10-0979755 | 8/2010 |
| KR | 10-2011-0001840 | 1/2011 |

* cited by examiner

*Primary Examiner* — Seahvosh Nikmanesh
*Assistant Examiner* — Evren Seven
(74) *Attorney, Agent, or Firm* — Onello & Mello, LLP

(57) ABSTRACT

A sacrificial pattern is formed to partially cover the pipe-shaped electrode. A sacrificial spacer is formed on a lateral surface of the sacrificial pattern. The sacrificial spacer extends across the pipe-shaped electrode. The sacrificial spacer has a first side and a second side opposite the first side. The sacrificial pattern is removed to expose the pipe-shaped electrode proximal to the first and second sides of the sacrificial spacer. The pipe-shaped electrode exposed on both sides of the sacrificial spacer may be primarily trimmed. The pipe-shaped electrode is retained under the sacrificial spacer to form a first portion, and a second portion facing the first portion. The second portion of the pipe-shaped electrode is secondarily trimmed. The sacrificial spacer is removed to expose the first portion of the pipe-shaped electrode. A data storage plug is formed on the first portion of the pipe-shaped electrode.

16 Claims, 27 Drawing Sheets

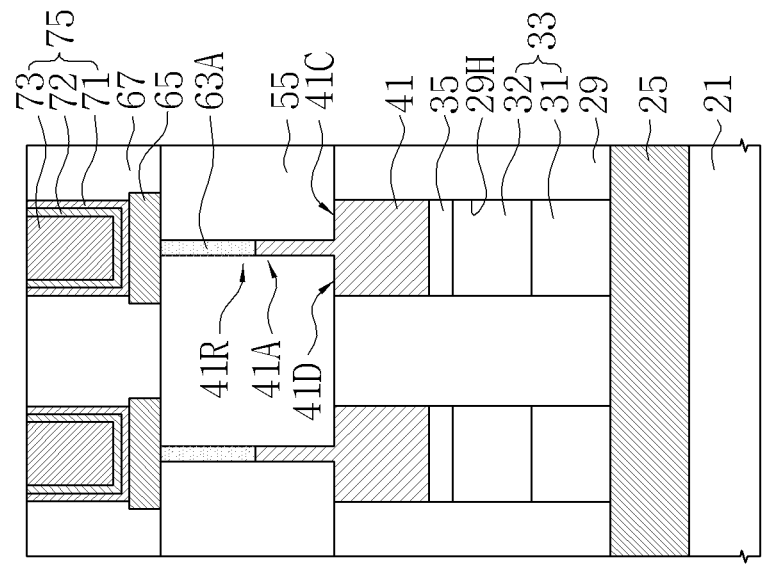
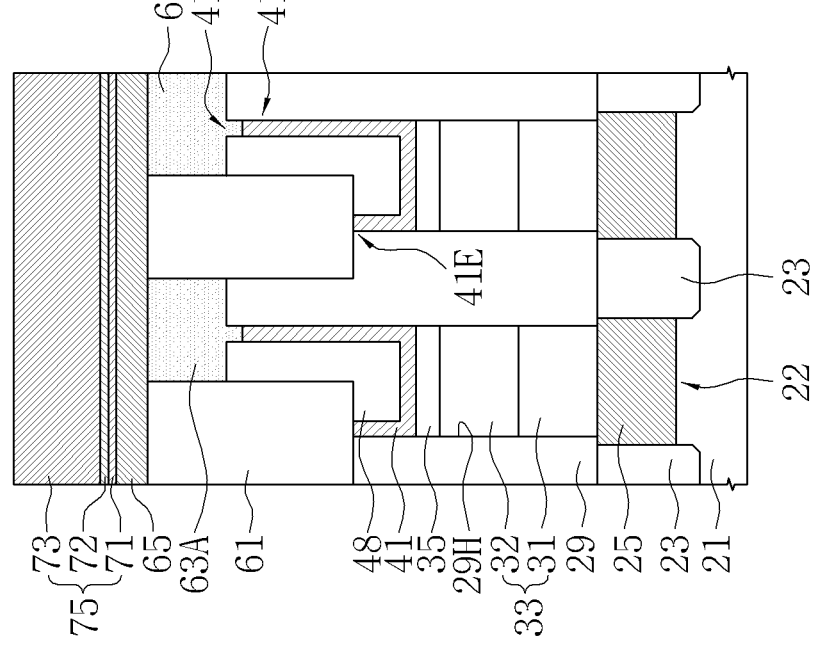
FIG. 4A
FIG. 4B

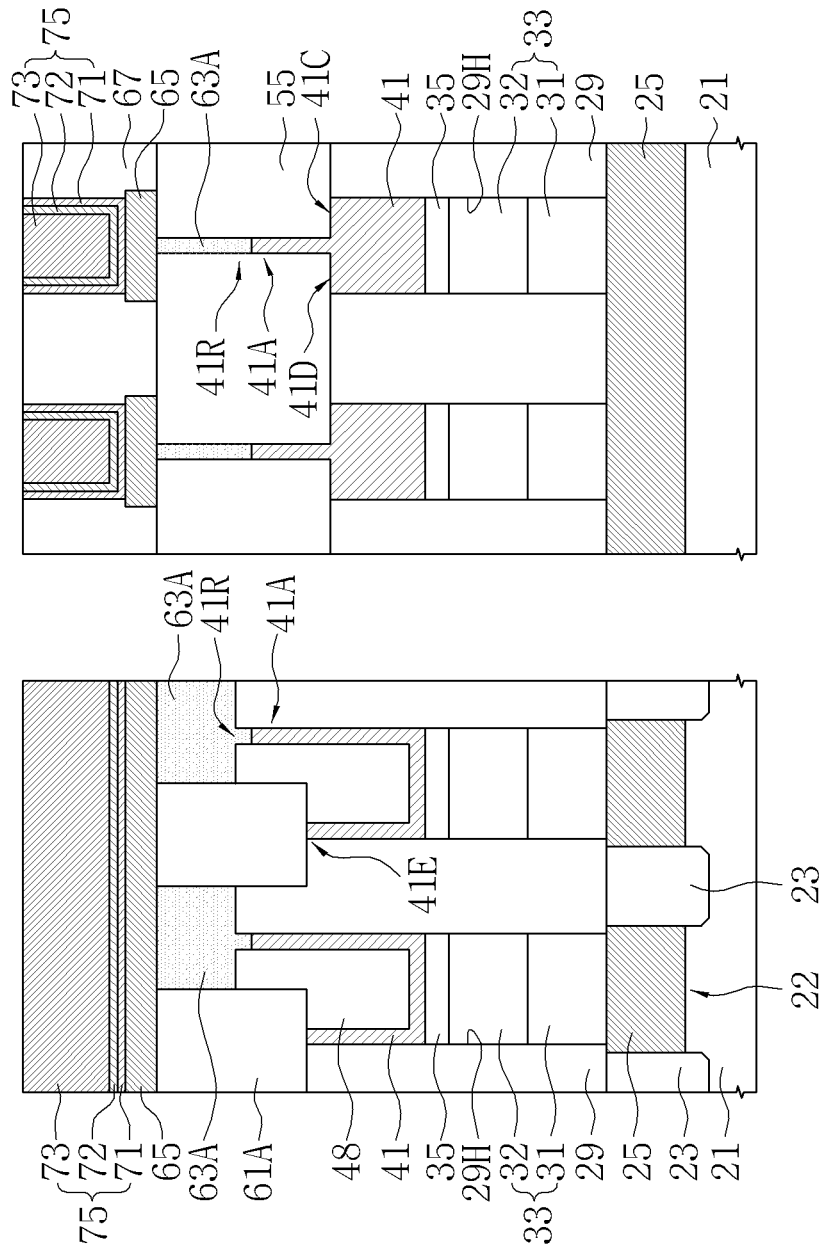

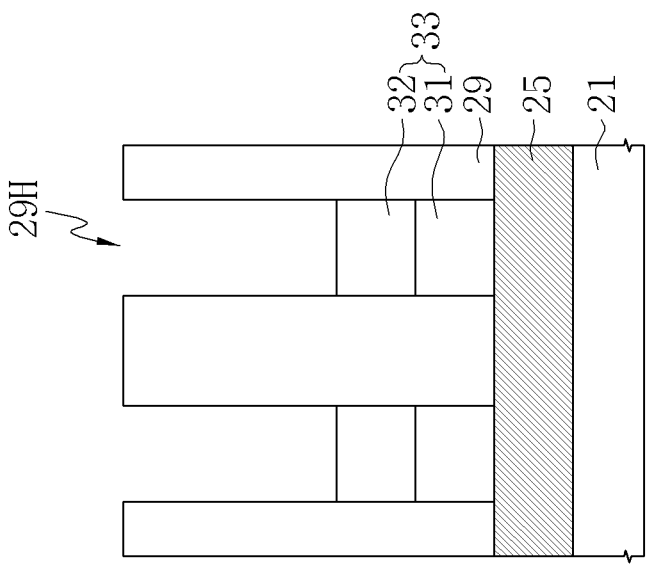
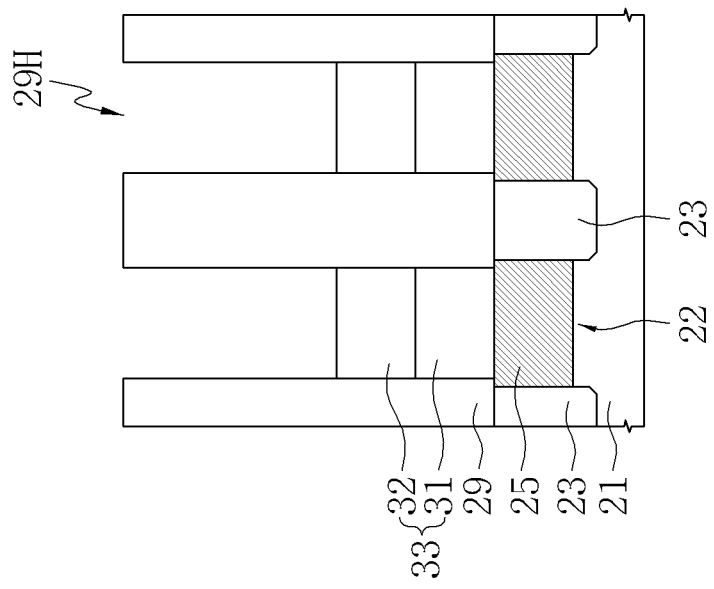

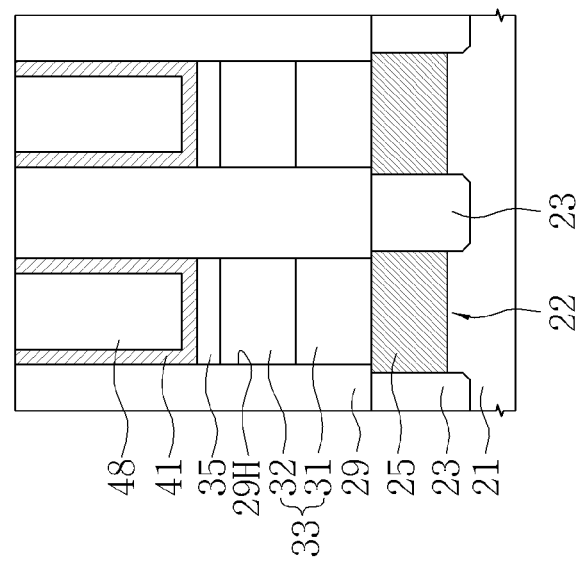
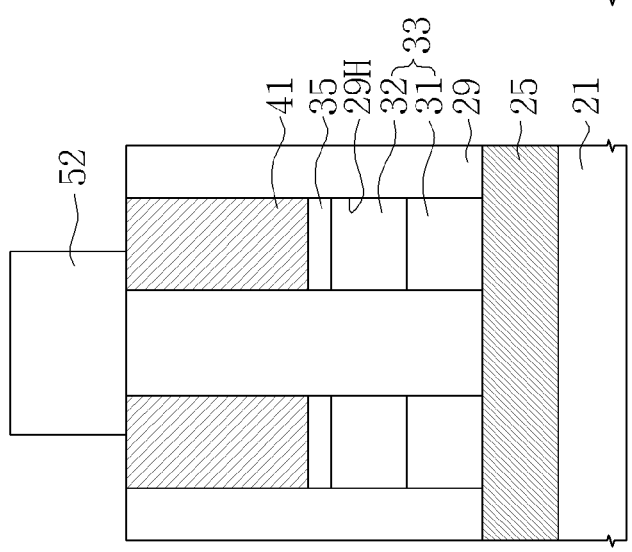
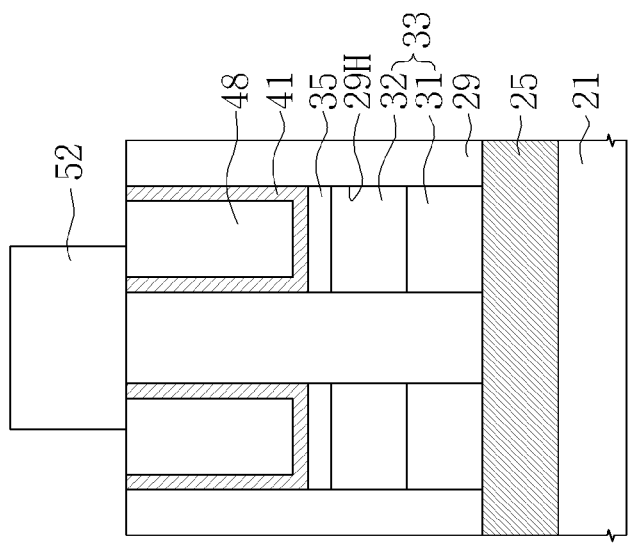

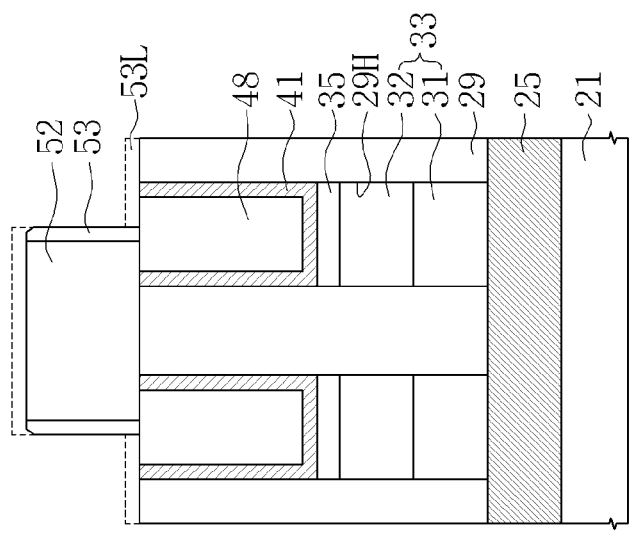
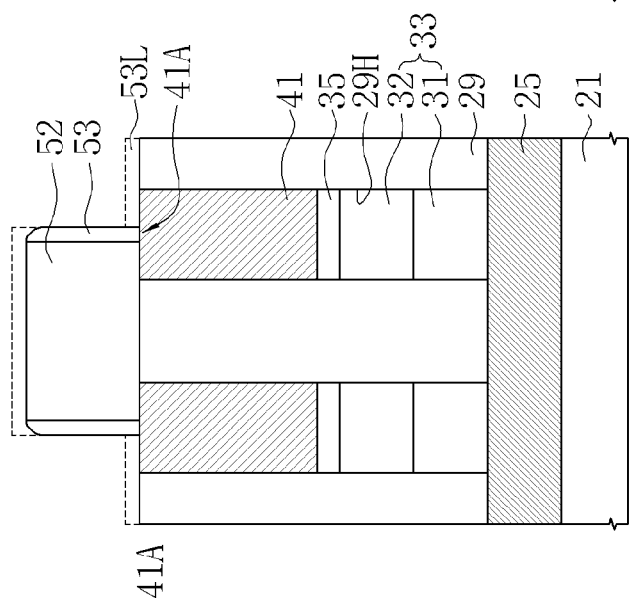
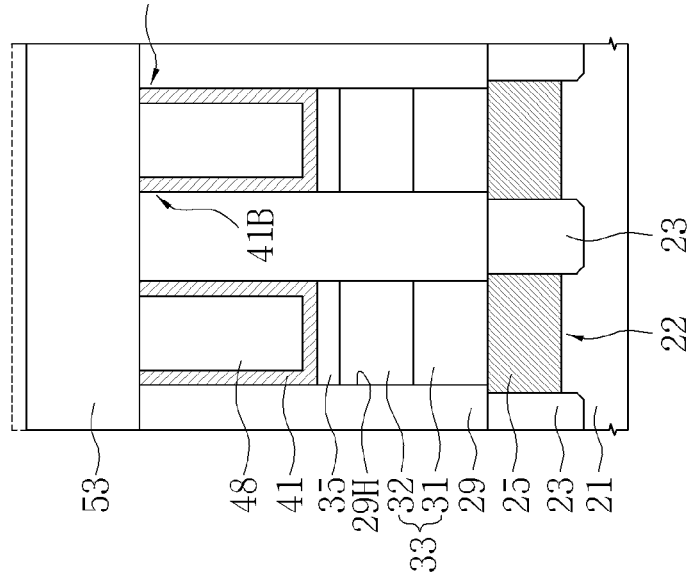

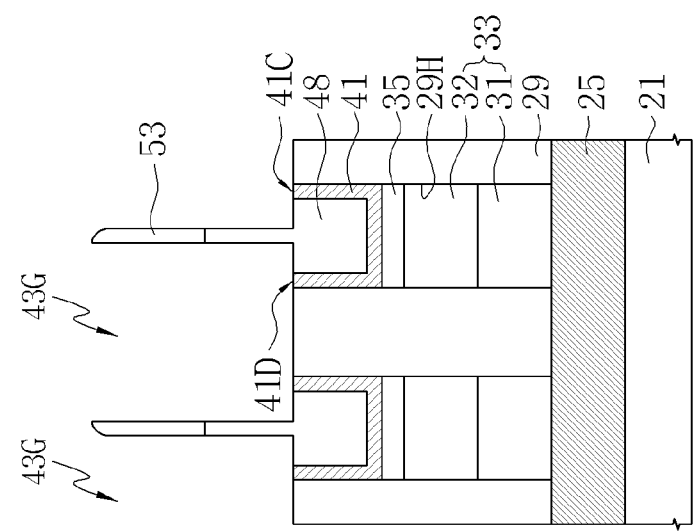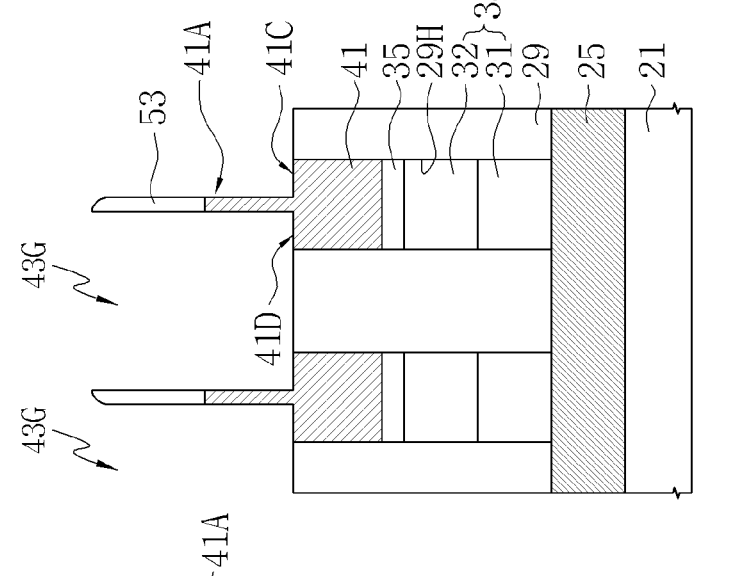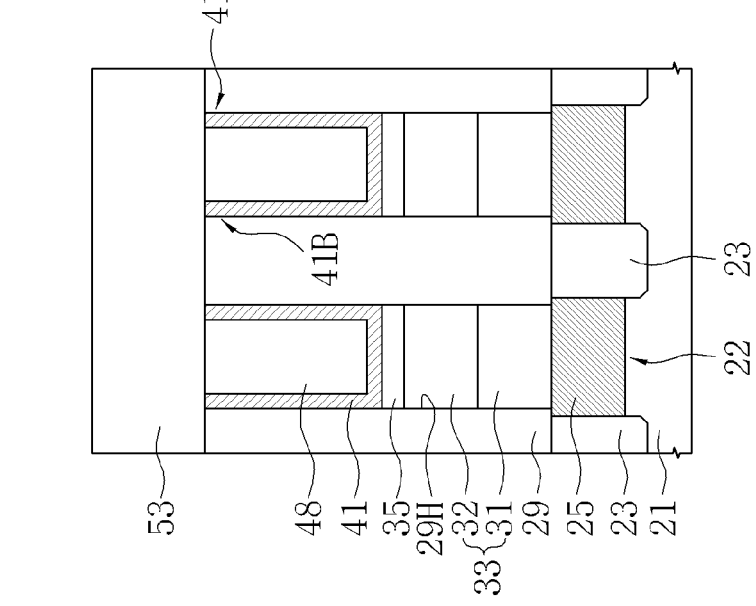

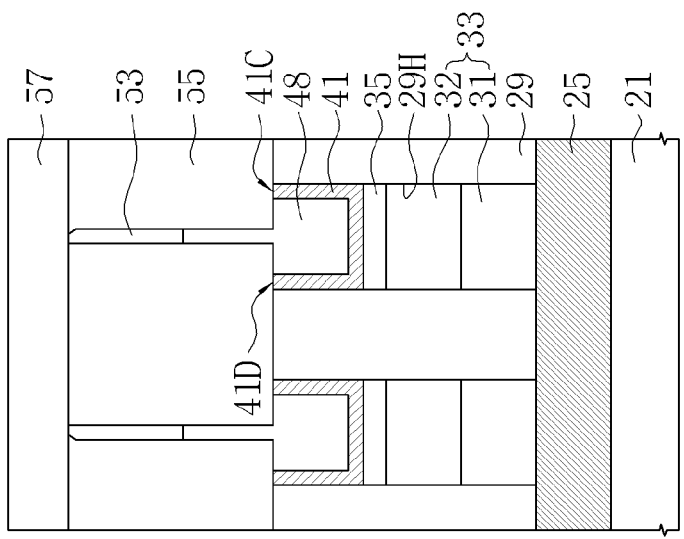
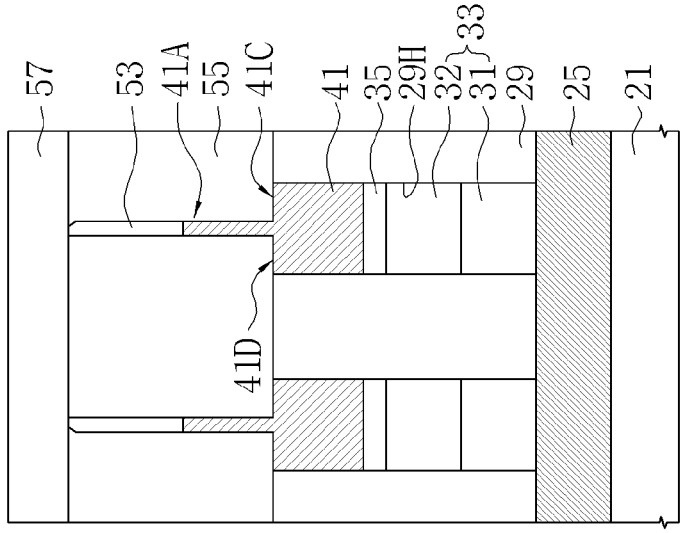
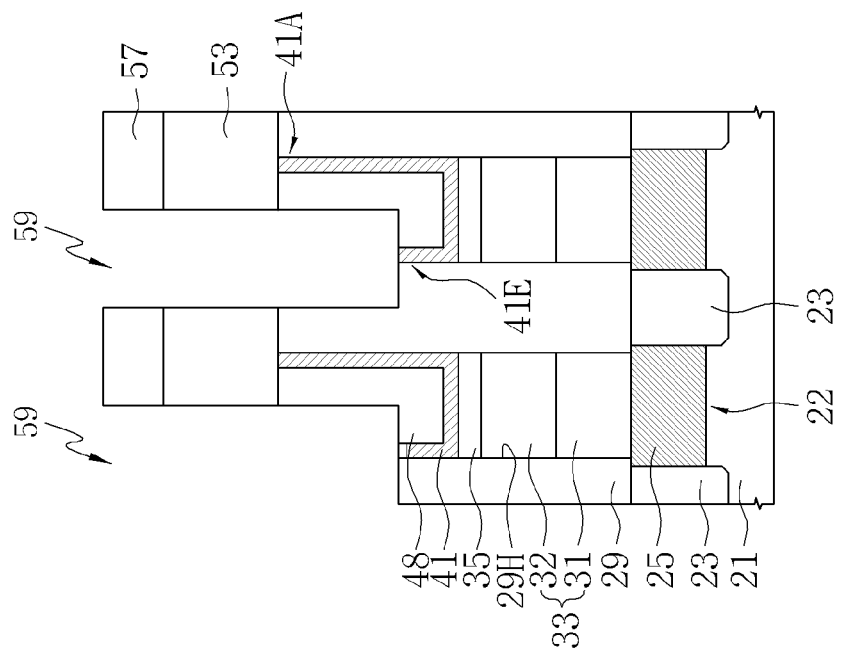

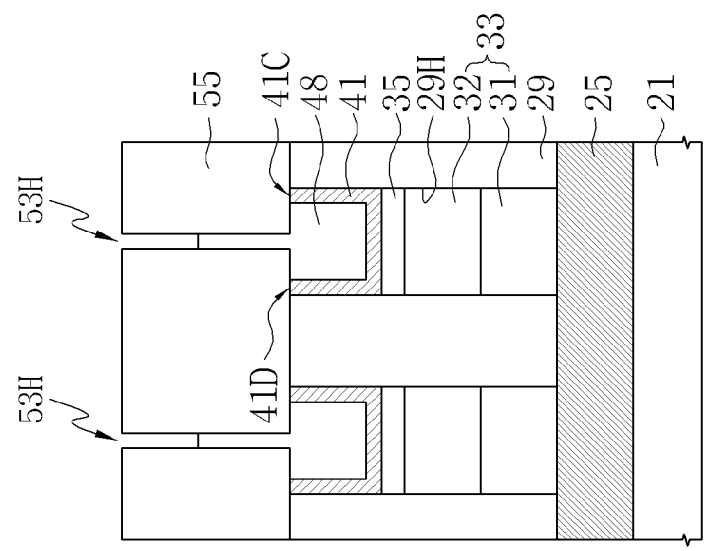
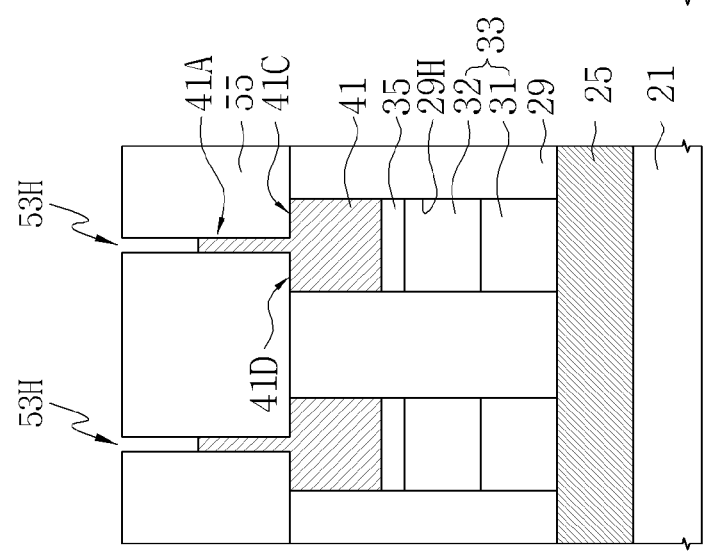
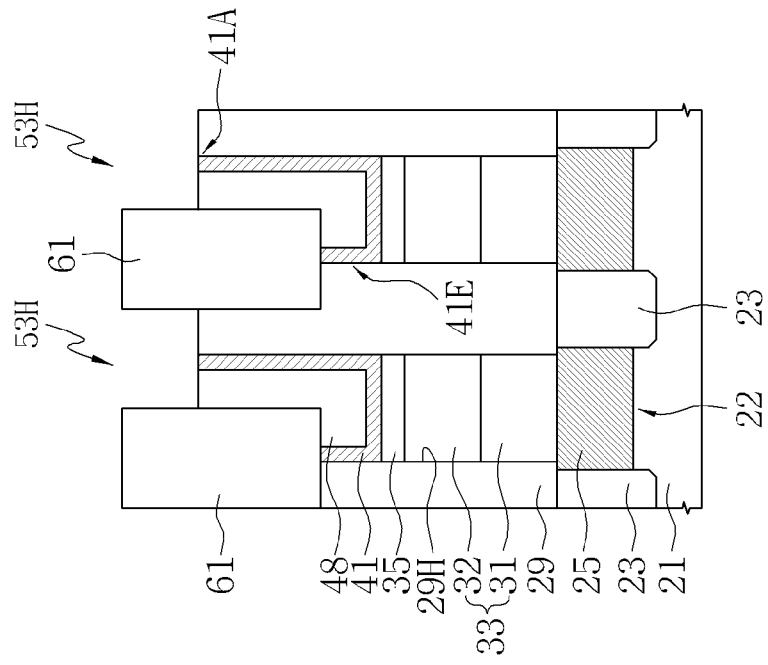

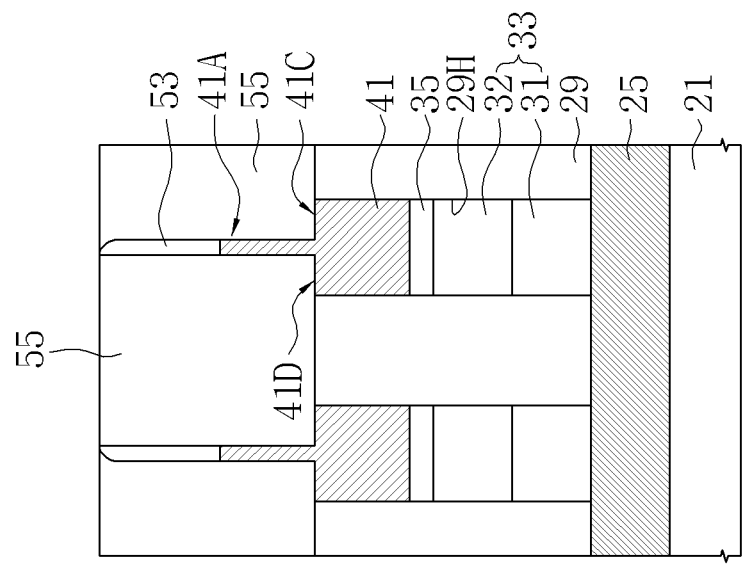
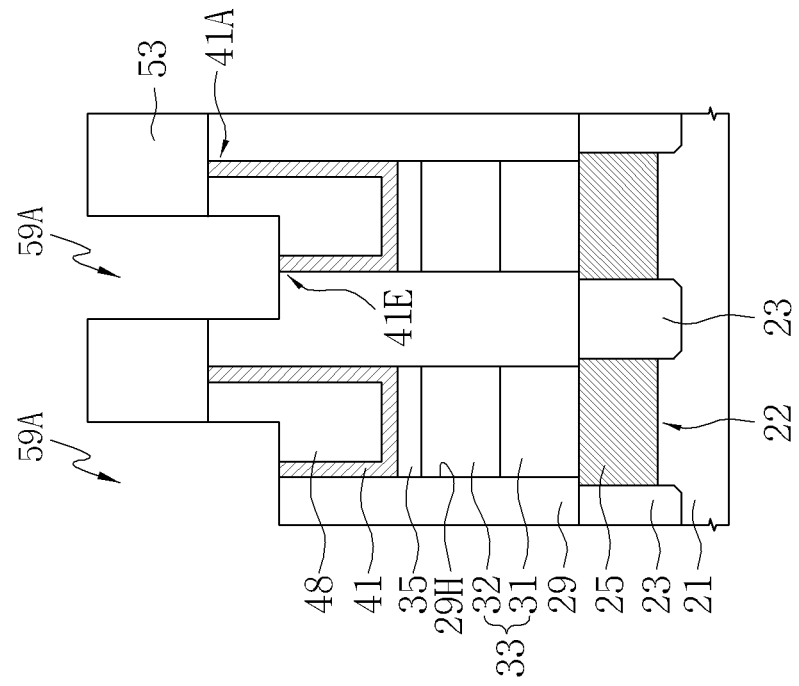

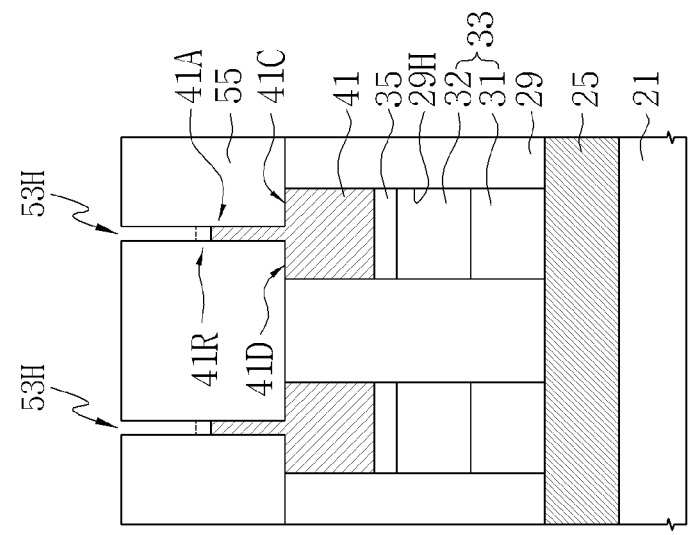
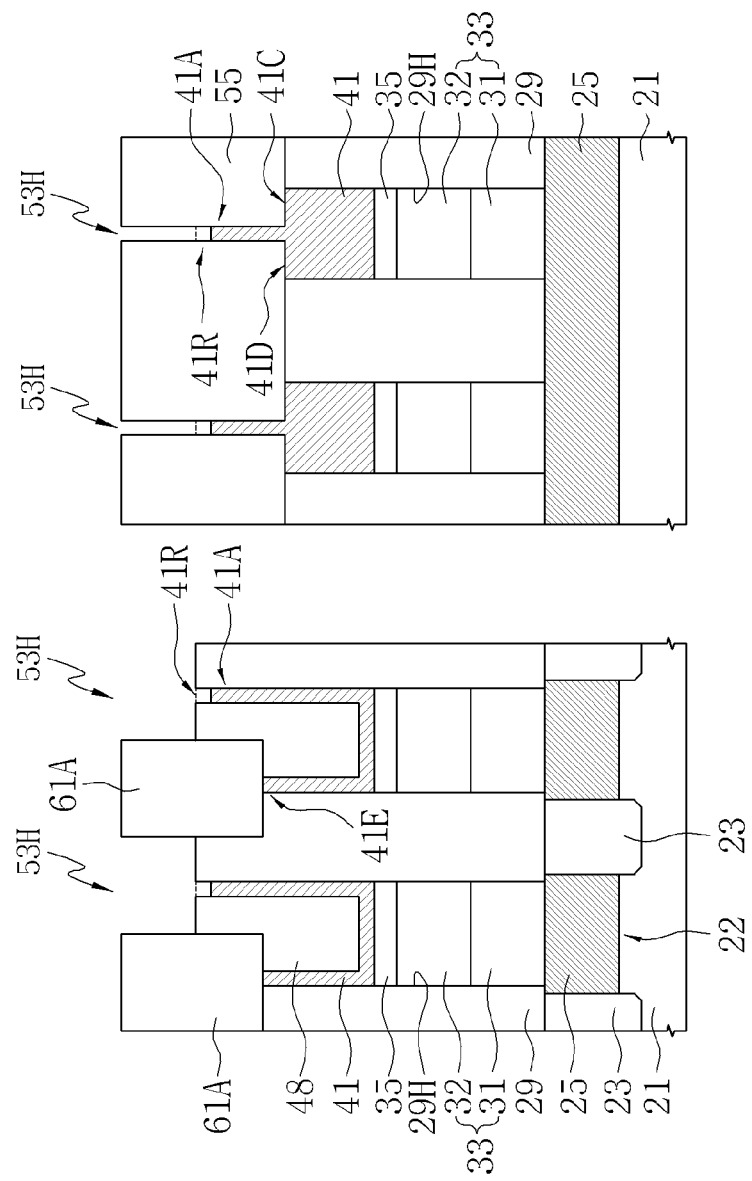

METHOD OF FABRICATING NON-VOLATILE MEMORY DEVICE HAVING SMALL CONTACT AND RELATED DEVICES

CROSS-REFERENCE TO RELATED APPLICATION

This application claims priority under 35 U.S.C. §119 to Korean Patent Application No. 10-2011-0107159 filed on Oct. 19, 2011, the disclosure of which is hereby incorporated by reference in its entirety.

BACKGROUND

1. Field

Embodiments of the inventive concept relate to a method of fabricating a non-volatile memory device and related devices.

2. Description of Related Art

Research has been conducted on various approaches for reducing a program current in a non-volatile memory device, such as a phase-change random access memory (PRAM).

SUMMARY

Embodiments of the inventive concepts provide a method of fabricating a non-volatile memory device, which may shorten a contact area between a lower electrode and a data storage plug, and reduce a program current.

Other embodiments of the inventive concepts provide a non-volatile memory device, which may shorten a contact area between a lower electrode and a data storage plug, and reduce a program current.

Aspects of the inventive concepts should not be limited by the above description, and other unmentioned aspects will be clearly understood by one of ordinary skill in the art from example embodiments described herein.

In accordance with an aspect of the inventive concepts, a method of fabricating a non-volatile memory device is provided. The method includes forming a pipe-shaped electrode on a substrate having a word line. A sacrificial pattern is formed to partially cover the pipe-shaped electrode. A sacrificial spacer is formed on a lateral surface of the sacrificial pattern. The sacrificial spacer extends across the pipe-shaped electrode. The sacrificial spacer has a first side and a second side opposite the first side. The sacrificial pattern is removed to expose the pipe-shaped electrode proximal to the first and second sides of the sacrificial spacer. The pipe-shaped electrode proximal to the first and second sides of the sacrificial spacer is primarily trimmed. The pipe-shaped electrode is retained under the sacrificial spacer to form a first portion, and a second portion facing the first portion. The second portion of the pipe-shaped electrode is secondarily trimmed. The sacrificial spacer is removed to expose the first portion of the pipe-shaped electrode. A data storage plug is formed on the first portion of the pipe-shaped electrode.

In an embodiment, the formation of the sacrificial spacer includes forming a spacer layer to cover a top surface of the substrate having the sacrificial pattern, and removing the spacer layer until the pipe-shaped electrode is exposed. In an embodiment, the formation of the spacer layer is performed using an atomic layer deposition (ALD) method.

In an embodiment, a third portion and a fourth portion of the pipe-shaped electrode may be formed in response to the primary trimming of the pipe-shaped electrode. The third and fourth portions are lower than a top end of the first portion, and higher than the second portion.

In an embodiment, at least one lateral surface of the data storage plug is self-aligned with the first portion of the pipe-shaped electrode.

In an embodiment, one lateral surface of the data storage plug is vertically aligned with one lateral surface of the first portion of the pipe-shaped electrode.

In an embodiment, the first portion of the pipe-shaped electrode has a substantially same horizontal width as the data storage plug.

In an embodiment, before forming the sacrificial pattern, the method further includes forming a core pattern to fill the inside of the pipe-shaped electrode. In an embodiment, before forming the data storage plug, the method further includes recessing the first portion of the pipe-shaped electrode. In an embodiment, a bottom end of the data storage plug extends lower than a top end of the core pattern. In an embodiment, the data storage plug contacts a lateral surface of the core pattern.

In accordance with another aspect of the inventive concepts, a method of fabricating a non-volatile memory device is provided. The method includes forming a molding layer on a substrate. A plurality of contact holes are formed in the molding layer. Lower electrodes are formed on sidewalls of the contact holes. A plurality core patterns are formed. Each core pattern fills a contact hole of the contact holes, respectively. Sacrificial spacers are formed that extend across the contact holes and are parallel to one another. The lower electrodes, the core patterns, and the molding layer are primarily trimmed in a first direction using the sacrificial spacers as a mask to form a plurality of first grooves. Here, first portions of the lower electrodes and second portions facing the first portions are retained under the sacrificial spacers. First insulating patterns are formed in the first grooves. The sacrificial spacers, the first insulating patterns, the second portions of the lower electrodes, the core patterns, and the molding layer are secondarily trimmed in a second direction orthogonal to the first direction to form a plurality of second grooves. Second insulating patterns are formed in the second grooves. The sacrificial spacers are removed to form trenches exposing the first portions of the lower electrodes. Data storage plugs are formed within the trenches. The data storage plugs are respectively formed between the first insulating patterns and the second insulating patterns.

In an embodiment, a horizontal width of the first portions of the lower electrodes is less than half a diameter of the contact holes. In an embodiment, the horizontal width of the first portions of the lower electrodes is between 1 nm and 10 nm.

In an embodiment, the method further comprises, before forming the lower electrodes, forming a plurality of diodes in the contact holes, and forming metal silicide patterns on the diodes. In an embodiment, the lower electrodes are self-aligned on the diodes.

In accordance with another aspect of the inventive concepts, a non-volatile memory device is provided. The non-volatile memory device comprises a substrate, a word line at the substrate, and a lower electrode on the substrate. The lower electrode has a first portion extending in a vertical direction relative to a horizontal direction of extension of the substrate from a first side of the lower electrode and a second portion extending in the vertical direction from a second side of the lower electrode opposite the first side. The first portion has a greater length than the second portion. A data storage plug is on the first portion of the lower electrode.

In an embodiment, the non-volatile memory device further comprises a diode between the lower electrode and the word line. The lower electrode is self-aligned on the diode.

In an embodiment, the non-volatile memory device further comprises an upper electrode on the diode.

In an embodiment, the lower electrode has a third portion and a fourth portion opposite the fourth portion, the third and fourth portions having top surfaces that are lower than a top surface of the first portion, and higher than a top surface of the second portion.

In an embodiment, the non-volatile memory device further comprises a core pattern. The first and second portions are positioned along sidewalls of the core pattern.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 4A and 5A are cross-sectional views taken along line I-I' of FIG. 2, illustrating non-volatile memory devices according to embodiments of the inventive concepts;

FIGS. 4B and 5B are cross-sectional views taken along line II-II' of FIG. 2;

FIGS. 6A through 19A are cross-sectional views taken along line I-I' of FIG. 2, illustrating a method of fabricating a non-volatile memory device according to other embodiments of the inventive concepts;

FIGS. 6B through 19B are cross-sectional views taken along line II-II' of FIG. 2;

FIGS. 10C through 19C are cross-sectional views taken along line III-III' of FIG. 2;

FIGS. 20A, 21, 22A, and 23A are cross-sectional views taken along line I-I' of FIG. 2, illustrating a method of fabricating a non-volatile memory device according to other embodiments of the inventive concepts;

FIGS. 20B, 22B, and 23B are cross-sectional views taken along line II-II' of FIG. 2;

DETAILED DESCRIPTION OF THE EMBODIMENTS

Figure 1A:
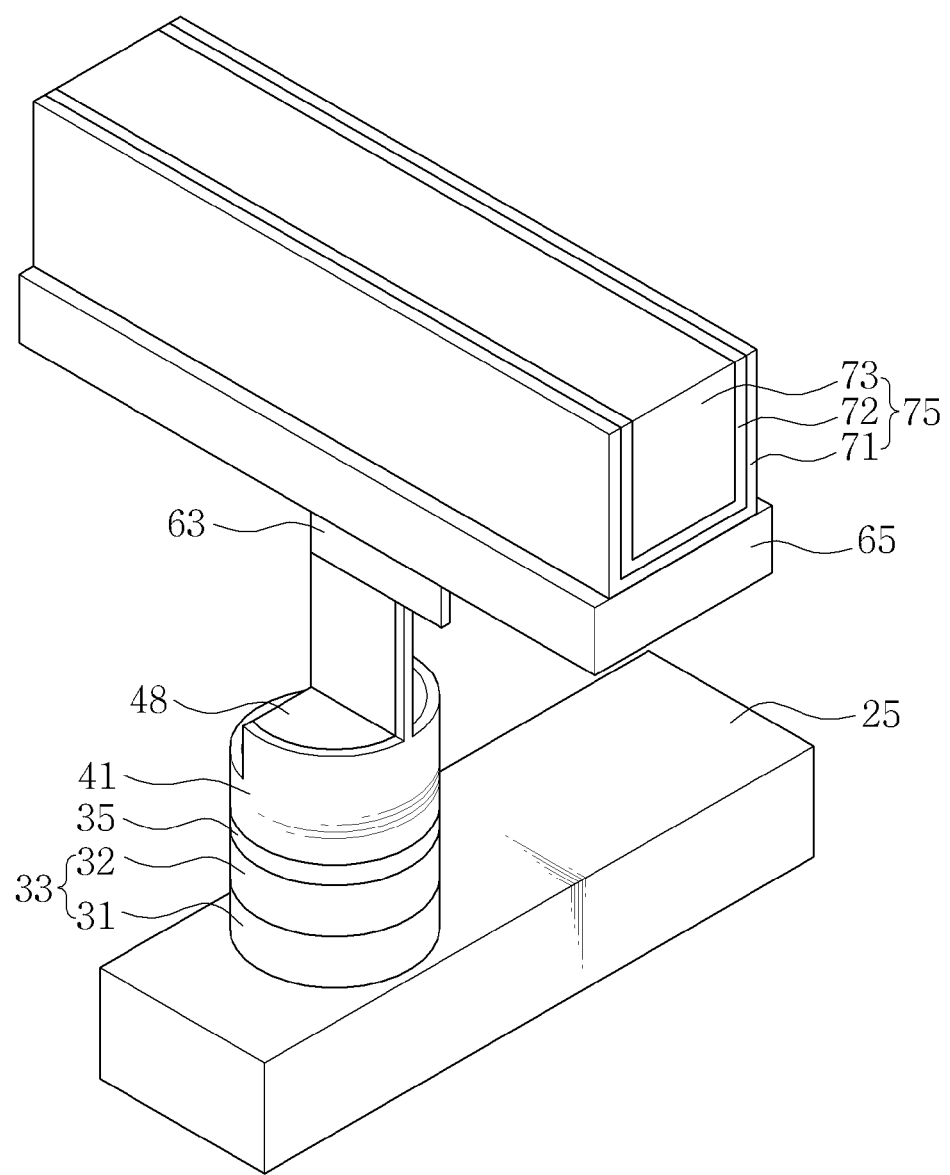
FIG. 1A is a perspective view of a non-volatile memory device, according to embodiments of the inventive concepts.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. In addition, like numbers refer to like element throughout.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Spatially relative terms, such as "top end", "bottom end", "top surface", "bottom surface", "upper", and "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
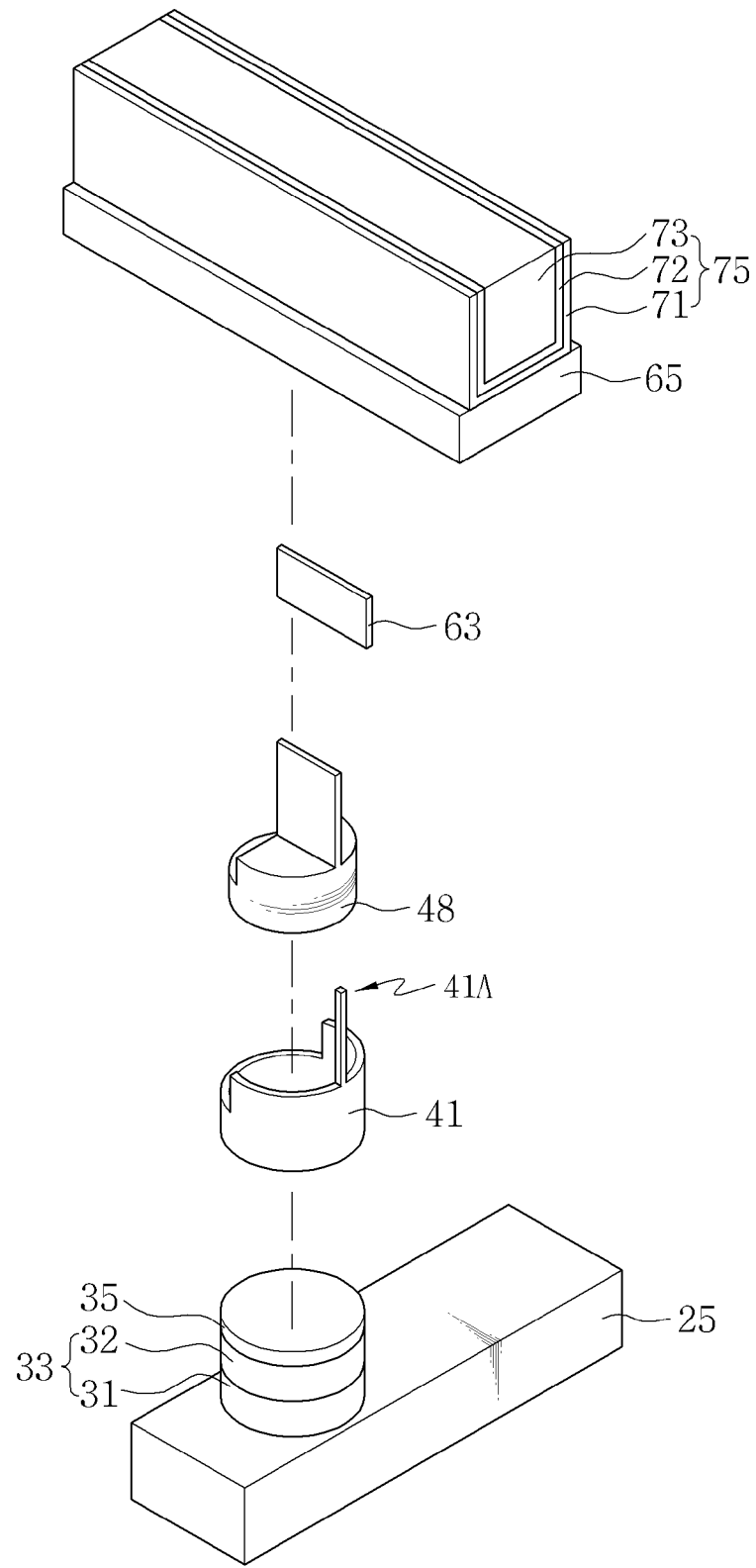
FIG. 1B is an exploded perspective view of the memory device of FIG. 1A.
Figure 2:
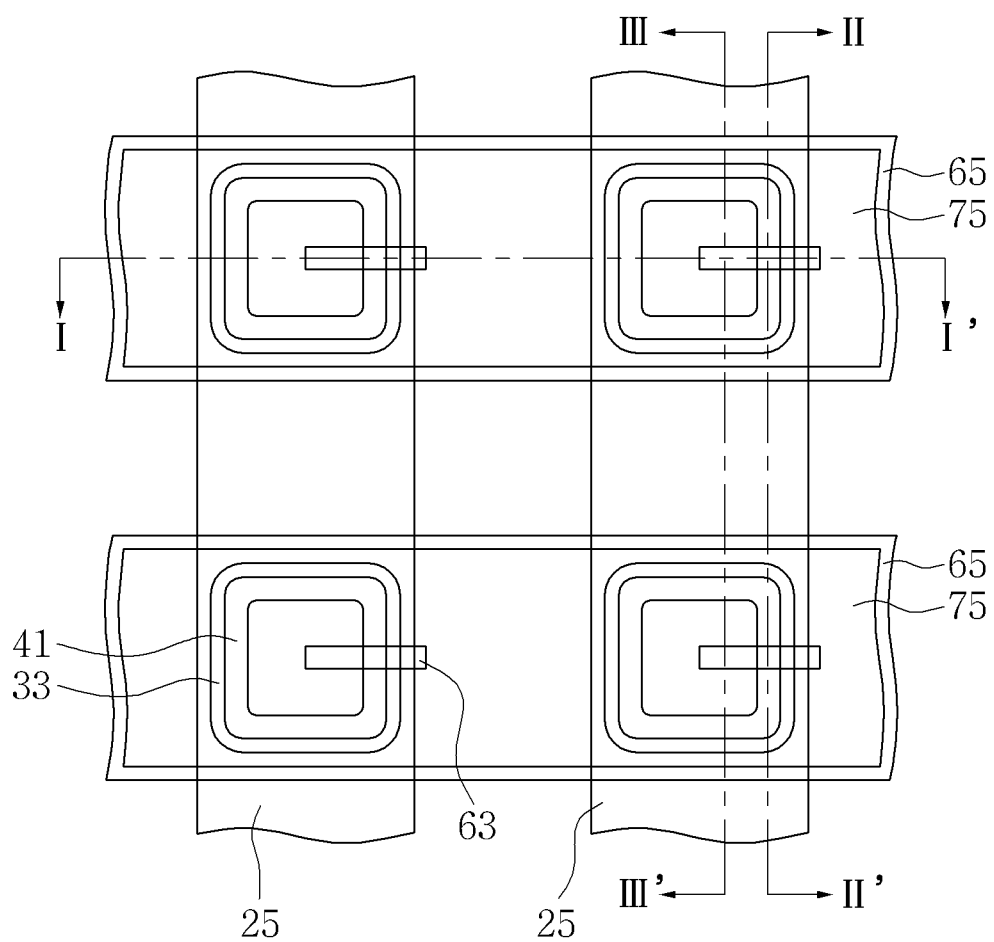
FIG. 2 is a layout illustrating the non-volatile memory device shown in FIGS. 1A and 1B.
Figure 3A:
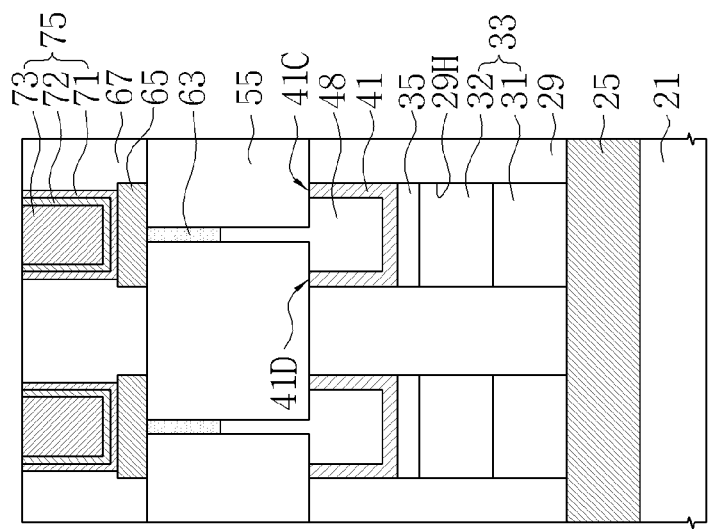
FIG. 3A is a cross-sectional view taken along line I-I' of FIG. 2.
Figure 3B:
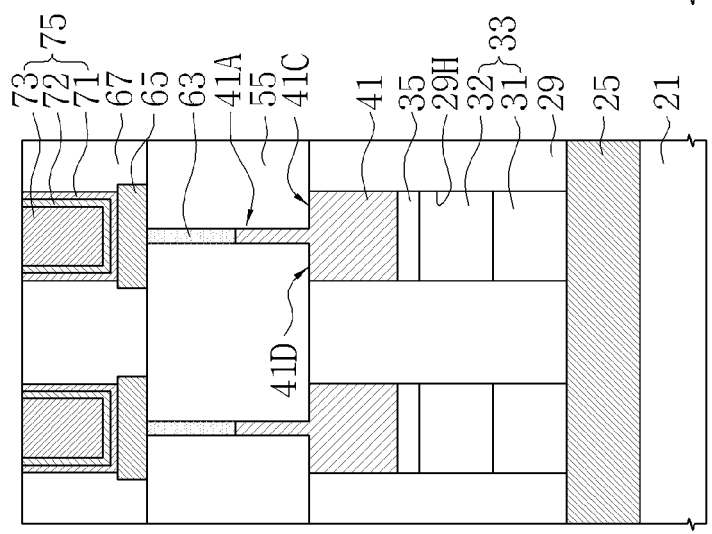
FIG. 3B is a cross-sectional view taken along line II-II' of FIG. 2.
Figure 3C:
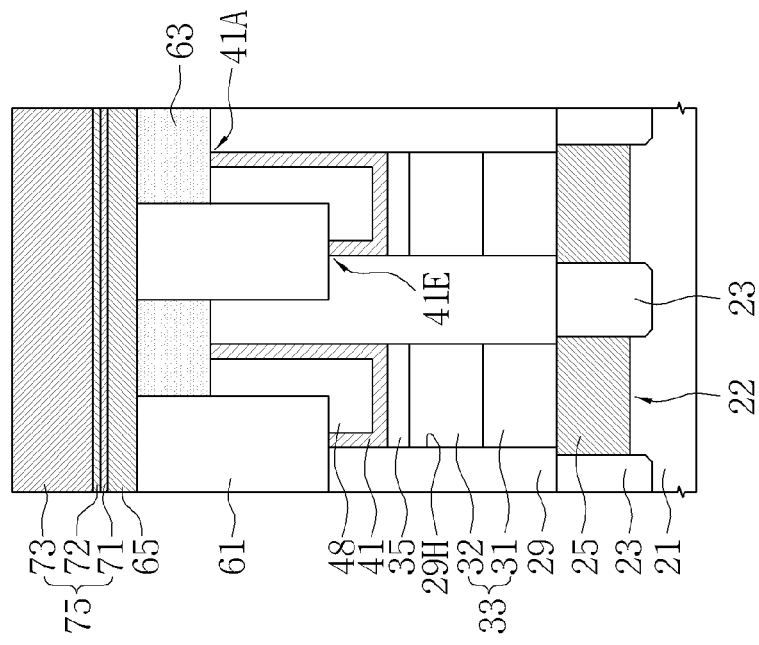
FIG. 3C is a cross-sectional view taken along line III-III' of FIG. 2.

FIG. 1A is a perspective view of main components of a non-volatile memory device according to embodiments of the inventive concept, and FIG. 1B is an exploded perspective view of the memory device of FIG. 1A. FIG. 2 is a layout illustrating the non-volatile memory device shown in FIGS. 1A and 1B. FIG. 3A is a cross-sectional view taken along line I-I' of FIG. 2. FIG. 3B is a cross-sectional view taken along line II-II' of FIG. 2. FIG. 3C is a cross-sectional view taken along line III-III' of FIG. 2.

Referring to FIGS. 1A and 1B, a diode 33 may be formed on a word line 25. The diode 33 may include a first semiconductor pattern 31 and a second semiconductor pattern 32 stacked sequentially. A metal suicide pattern 35 may be formed on the diode 33. A lower electrode 41 may be formed on the metal silicide pattern 35. A core pattern 48 may be formed within the lower electrode 41. A data storage plug 63 may be formed on the lower electrode 41. An upper electrode 65 may be formed on the data storage plug 63. A bit line 75 may be formed on the upper electrode 65. The bit line 75 may include a barrier metal layer 71, a seed layer 72, and a conductive layer 73.

The metal silicide pattern 35 and the lower electrode 41 may be self-aligned on the diode 33. A first portion 41A of the lower electrode 41 may protrude from the main body of the lower electrode 41, for example, in an upward direction. The data storage plug 63 may be self-aligned with respect to the first portion 41A of the lower electrode 41. A lateral surface of the data storage plug 63 may be vertically aligned with a protruding surface of the first portion 41A of the lower electrode 41.

Referring to FIG. 2, word lines 25 may be formed in a cell array region of the non-volatile memory device and aligned parallel to one another. One or more upper electrodes 65 may be formed to cross over the word lines 25. One or more bit lines 75 may be formed on the upper electrodes 65. Diodes 33, lower electrodes 41, and data storage plugs 63 may be formed at intersections between the word lines 25 and the bit lines 75.

Referring to FIGS. 2 and 3A through 3C, an isolation layer 23 defining one or more active regions 22 may be formed at predetermined regions of a substrate 21. Word lines 25 may be formed within the active regions 22. A molding layer 29 may be formed on the word lines 25 and the isolation layer 23. Contact holes 29H may be formed through the molding layer 29. A first semiconductor pattern 31, a second semiconductor pattern 32, and a metal silicide pattern 35 may be sequentially stacked within each of the contact holes 29H. The first and second semiconductor patterns 31 and 32 may constitute the diode 33. The lower electrodes 41 may be formed on the metal silicide patterns 35. Core patterns 48 may be formed within the lower electrodes 41.

Data storage plugs 63 may be formed on first portions 41A of the lower electrodes 41. First insulating patterns 55 and second insulating patterns 61 may be formed on both sides of the first portions 41A and the data storage plugs 63. The first insulating patterns 55 may intersect the second insulating patterns 61. The upper electrodes 65 may be formed on the data storage plugs 63. An upper insulating layer 67 may be formed on the first insulating patterns 55, the second insulating patterns 61, and the upper electrodes 65. The bit lines 75 may be formed to penetrate the upper insulating layer 67 and contact the upper electrodes 65. Each of the bit lines 75 may include the barrier metal layer 71, the seed layer 72, and the conductive layer 73 stacked sequentially.

Each of the lower electrodes 41 may include the first portion 41A, a recessed second portion 41E disposed opposite the first portion 41A, and a third portion 41C and a fourth portion 41D disposed opposite each other on both sides of the first portion 41A and the recessed second portion 41E. The third and fourth portions 41C and 41D may be formed lower than a top end of the first portion 41A. The recessed second portion 41E may be formed at a lower region than the top surfaces of the third and fourth portions 41C and 41D. Lateral surfaces of the data storage plugs 63 may be vertically aligned with lateral surfaces of the first portions 41 as shown in FIG. 3B.

The second insulating patterns 61 may have bar shapes parallel to one another. The second insulating patterns 61 may partially cross the lower electrodes 41, the core patterns 48, and the molding layer 29. Bottom surfaces of the second insulating patterns 61 may be formed at lower levels than bottom surfaces of the first insulating patterns 55. The bottom portions of the second insulating patterns 61 may contact the recessed second portions 41E of the lower electrodes 41, the core patterns 48, and the molding layer 29, respectively. Lateral surfaces of the second insulating patterns 61 may contact the data storage plugs 63, the core patterns 48, the molding layer 29, and the first insulating patterns 55, respectively.

The first insulating patterns 55 may cross the second insulating patterns 61 at right angles. The first insulating patterns 55 may at least partially cross the lower electrodes 41, the core patterns 48, and the molding layer 29. Bottoms of the first insulating patterns 55 may be formed lower than top ends of the first portions 41A of the lower electrodes 41. The bottoms of the first insulating patterns 55 may contact the third and fourth portions 41C and 41D of the lower electrodes 41, the core patterns 48, and the molding layer 29. Lateral surfaces of the first insulating patterns 55 may contact the data storage plugs 63, the core patterns 48, the first portions 41A of the lower electrodes 41, and the second insulating patterns 61. The first portions 41A and the data storage plugs 63 may be vertically aligned between the first insulating patterns 55.

The bottom of the data storage plug 63 may contact top ends of the first portion 41A of the lower electrode 41, the core pattern 48, and the molding layer 29, respectively. The top end of the first portion 41A may be formed at substantially the same level as the top ends of the core pattern 48 and/or the molding layer 29.

FIGS. 4A and 5A are cross-sectional views taken along line I-I' of FIG. 2, illustrating non-volatile memory devices according to embodiments of the inventive concept, and FIGS. 4B and 5B are cross-sectional views taken along line II-II' of FIG. 2.

Referring to FIGS. 4A and 4B, a recess region 41R may be formed on first portions 41A of lower electrodes 41. That is, the first portions 41A of the lower electrodes 41 may be recessed lower than top ends of core patterns 48 and a molding layer 29. Data storage plugs 63A may be formed on the first portions 41A of the lower electrodes 41. The data storage plugs 63A may fill the recess region 41R and contact the first portions 41A.

Referring to FIGS. 5A and 5B, bottoms of second insulating patterns 61A may be formed at higher levels than bottoms of the first insulating patterns 55. In the first and second embodiments, the bottoms of the second insulating patterns 61A may be formed at lower levels than the bottoms of the first insulating patterns 55. The bottoms of the second insulating patterns 61A may contact recessed second portions 41E of the lower electrodes 41, the core patterns 48, and the molding layer 29. Lateral surfaces of the second insulating patterns 61A may contact the data storage plugs 63A, the core patterns 48, the molding layer 29, and the first insulating patterns 55. Top ends of the recessed second portions 41E of the lower electrodes 41 may be formed at higher levels than third and fourth portions 41C and 41D of the lower electrodes 41, and at lower levels than top ends of the first portions 41A.

FIGS. 6A through 19A are cross-sectional views taken along line I-I' of FIG. 2, illustrating a method of fabricating a non-volatile memory device according to embodiments of the inventive concept. FIGS. 6B through 19B are cross-sectional views taken along line II-II' of FIG. 2. FIGS. 10C through 19C are cross-sectional views taken along line III-III' of FIG. 2. The layout and cross-sectional views of FIGS. 2 and 6A through 19C may correspond to a cell region of a phase-change memory device.

Figure 6A:
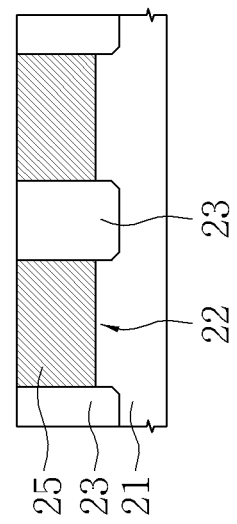
Figure 6B:
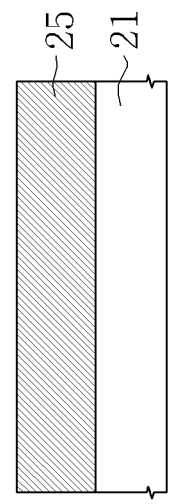

Referring to FIGS. 2, 6A, and 6B, an isolation layer 23 defining active regions 22 may be formed in predetermined regions of a substrate 21. Word lines 25 may be formed in the active regions 22. The word lines 25 may be parallel to one another. The isolation layer 23 may be formed between the word lines 25.

The substrate 21 may be a semiconductor substrate, such as a single crystalline silicon wafer or a silicon-on-insulator (SOI) wafer. Hereinafter, it will be assumed that the substrate 21 is a silicon wafer containing p-type impurity ions. The isolation layer 23 may be formed using a shallow trench isolation (STI) technique. The isolation layer 23 may include silicon oxide, silicon nitride, silicon oxynitride, or a combination thereof. The word lines 25 may be formed by implanting n-type impurity ions into the active regions 22.

In other embodiments, the word lines 25 may be conductive patterns formed on the substrate 21, a detailed description thereof will be omitted for brevity.

Figure 7A:
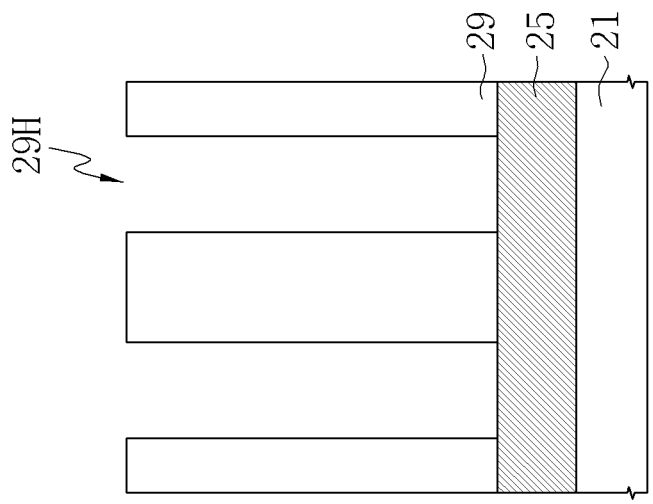
Figure 7B:
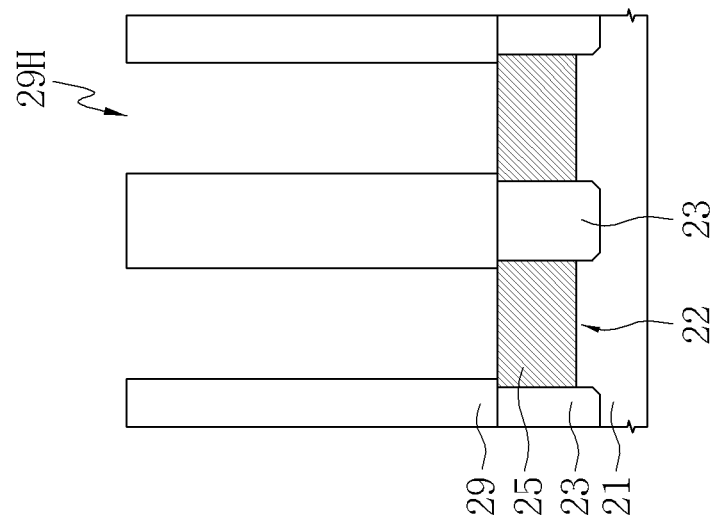

Referring to FIGS. 2, 7A, and 7B, a molding layer 29 may be formed on the substrate 21 having the word lines 25. Contact holes 29H may be formed to penetrate the molding layer 29 and expose the word lines 25. The contact holes 29H may be aligned at predetermined intervals along the word lines 25. The contact holes 29H may be separated from one another by a predetermined distance.

The molding layer 29 may include silicon oxide, silicon nitride, silicon oxynitride, or a combination thereof. The molding layer 29 may cover the word lines 25 and the isolation layer 23. Although an etch stop layer may be further formed between the word lines 25 and the molding layer 29, a detailed description thereof will be omitted for brevity. The contact holes 29H may be formed using a patterning technique. For example, the formation of the contact holes 29H may be performed using photolithography and anisotropic etching processes. Each of the contact holes 29H may have one of various shapes, such as a circular shape, a tetragonal shape, or a tetragonal shape with round corners. Each of the contact holes 29H may have a diameter less than a width of the word lines 25.

Referring to FIGS. 2 and 8A and 8B, a first semiconductor pattern 31 and a second semiconductor pattern 32 may be sequentially formed in each of the contact holes 29H. The first and second semiconductor patterns 31 and 32 may constitute a diode 33. The diode 33 may be formed such that a top surface of the diode 33 is at a lower level than a top surface of the molding layer 29. The diode 33 may serve as a switching element.

The first and second semiconductor patterns 31 and 32 may be formed in the contact holes 29H using a selective epitaxial growth (SEG) technique. The first semiconductor pattern 31 may be formed between the second semiconductor pattern 32 and the word lines 25. The first semiconductor pattern 31 may include a silicon layer containing n-type impurity ions. The second semiconductor pattern 32 may include a silicon layer containing p-type impurity ions. In other embodiments, the first and second semiconductor patterns 31 and 32 are stacked in a reverse order, i.e., the first semiconductor pattern 31 is formed on the second semiconductor pattern 32.

Figure 9A:
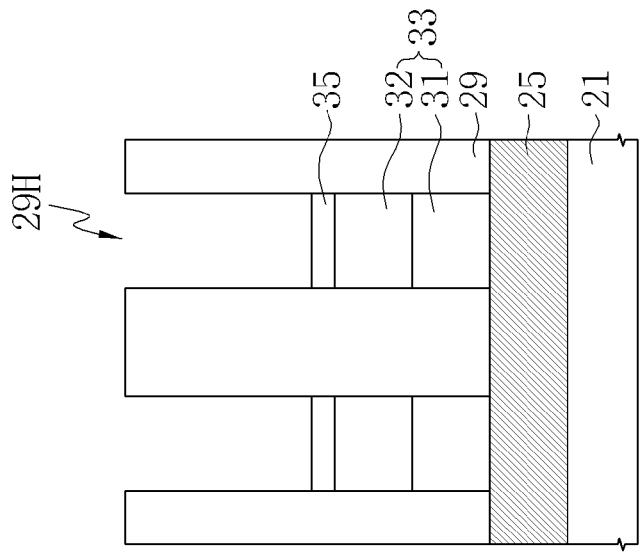
Figure 9B:
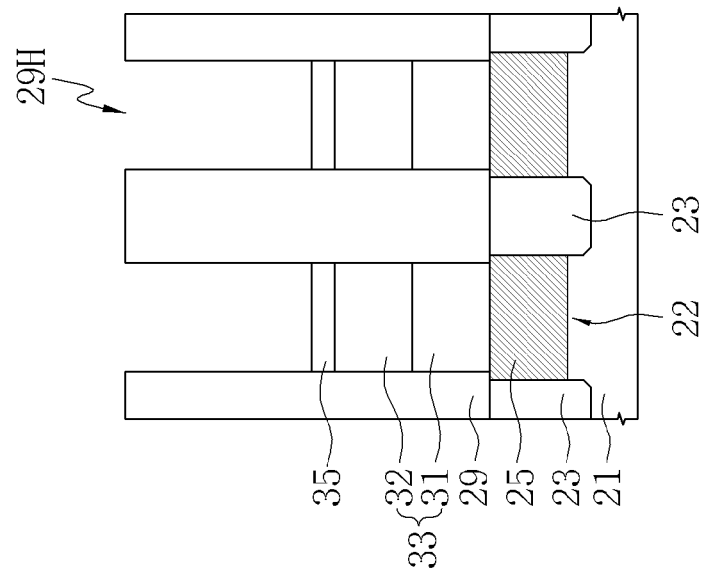
Figure 10A:
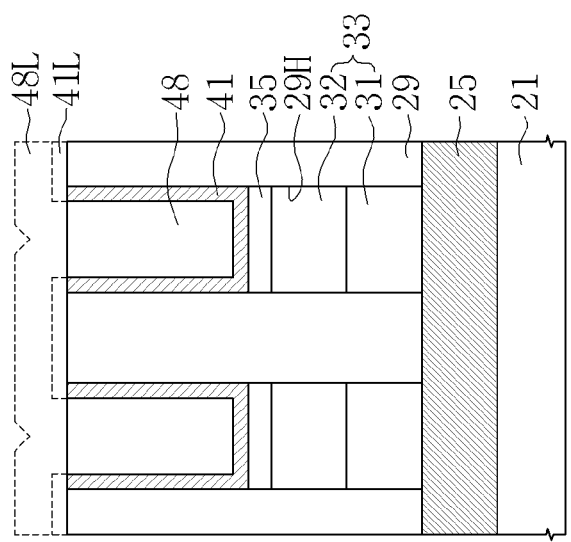
Figure 10B:
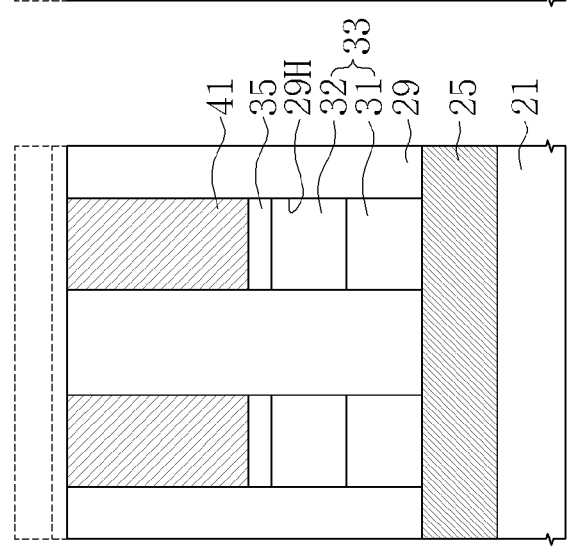
Figure 10C:
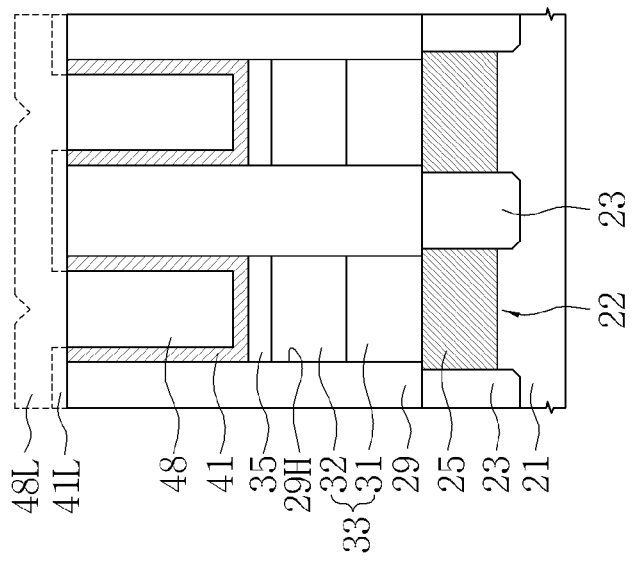
Figure 14A:
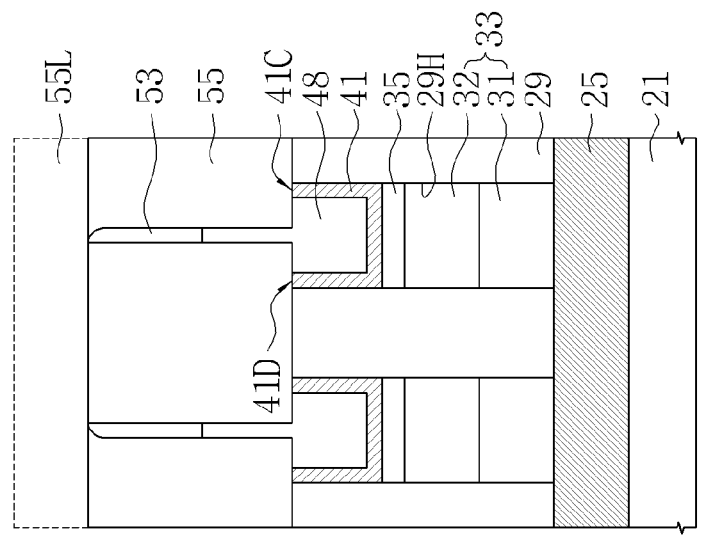
Figure 14B:
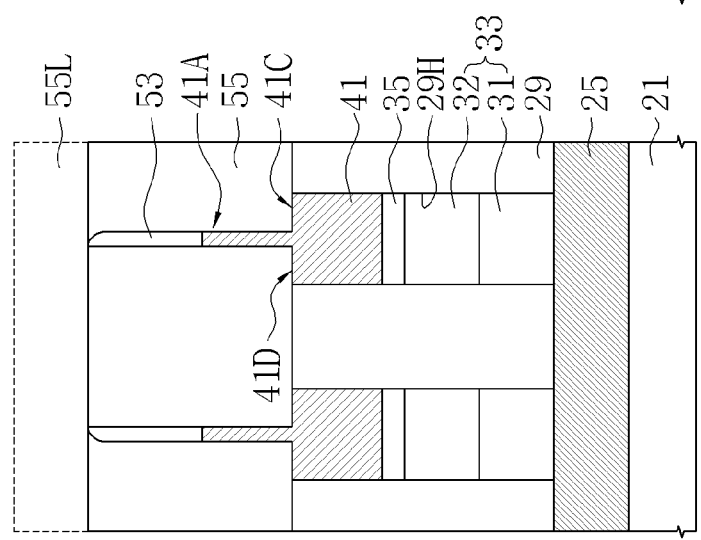
Figure 14C:
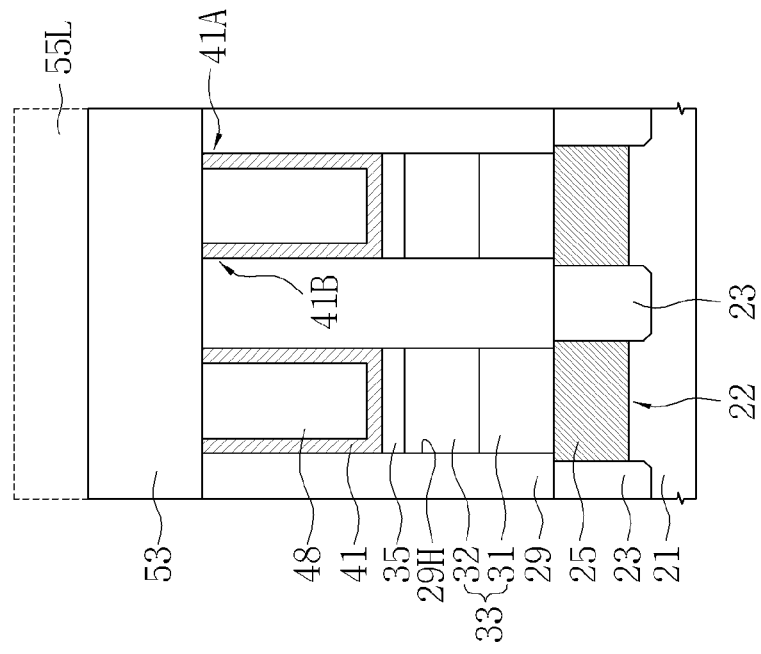
Figure 16A:
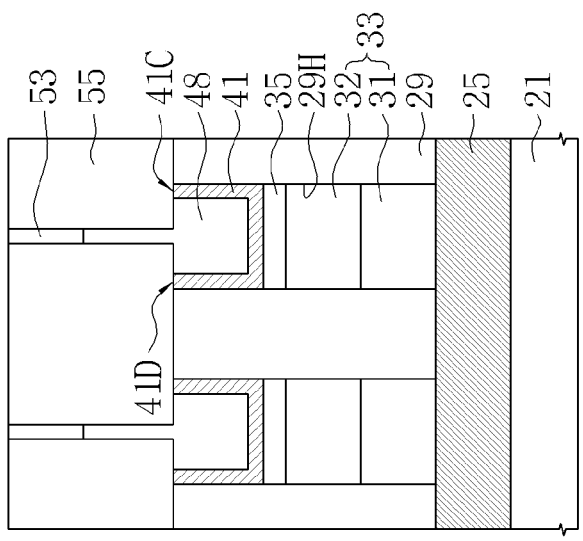
Figure 16B:
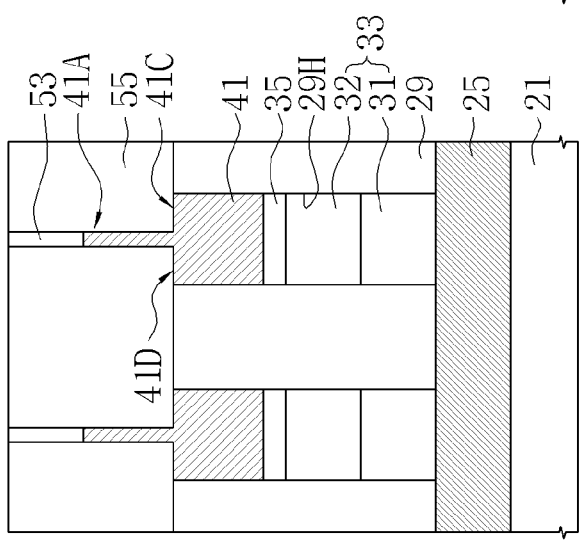
Figure 16C:
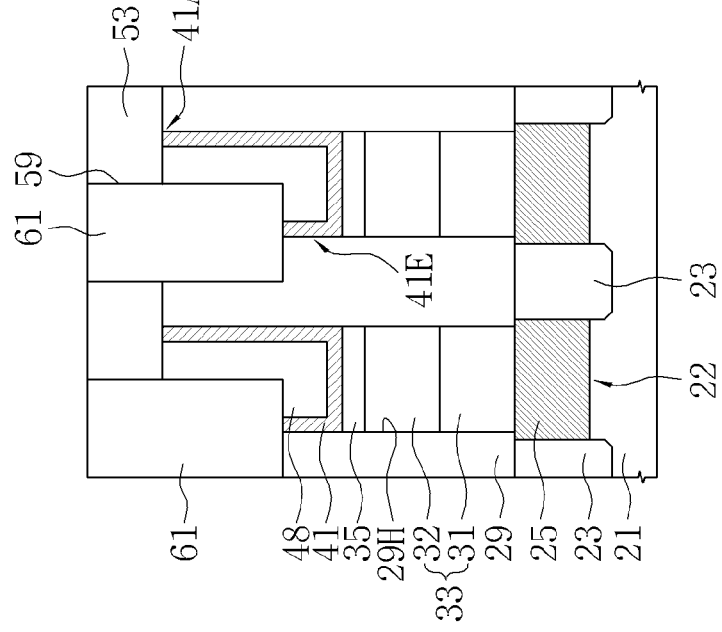
Figure 18B:
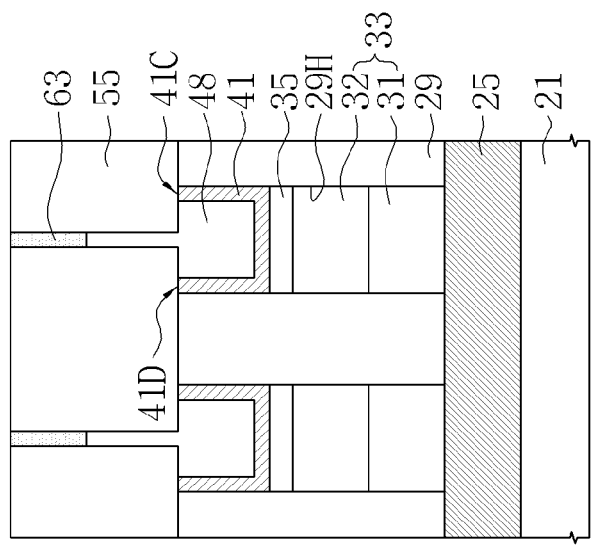
Figure 18C:
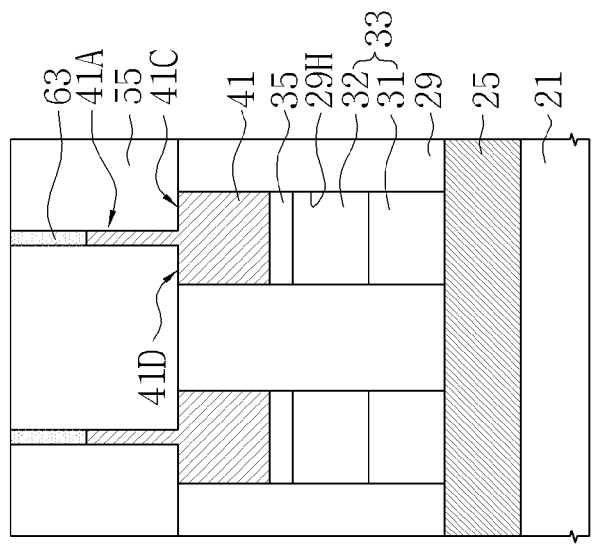
Figure 18A:
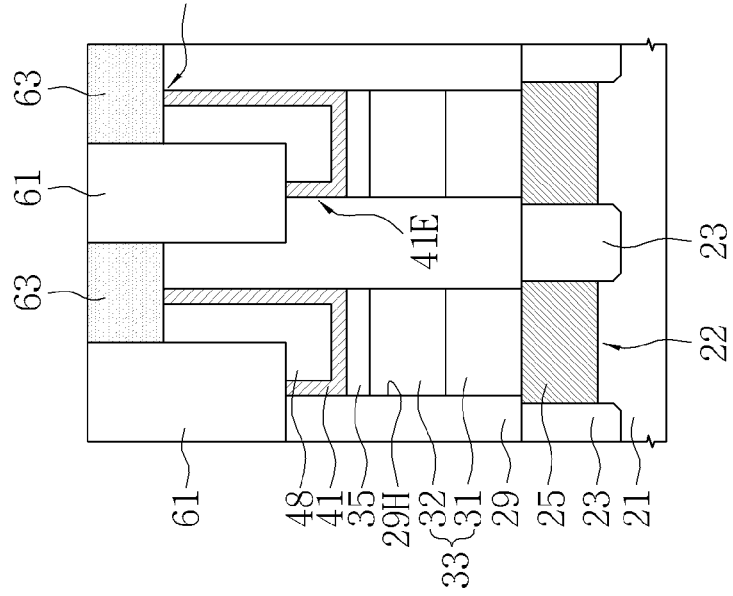
Figure 19A:
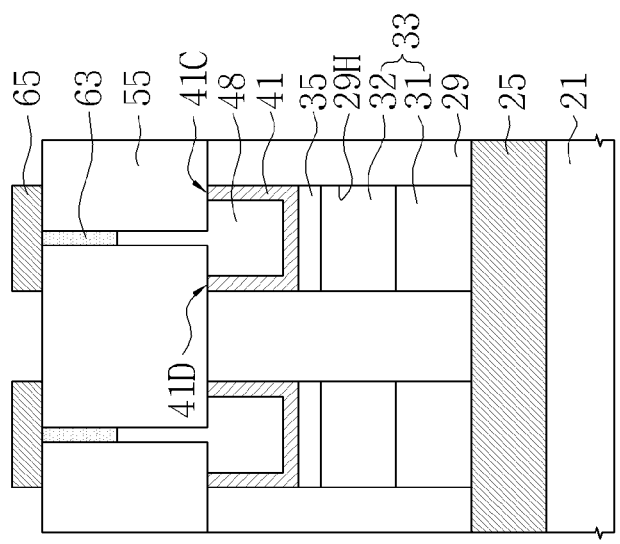
Figure 19B:
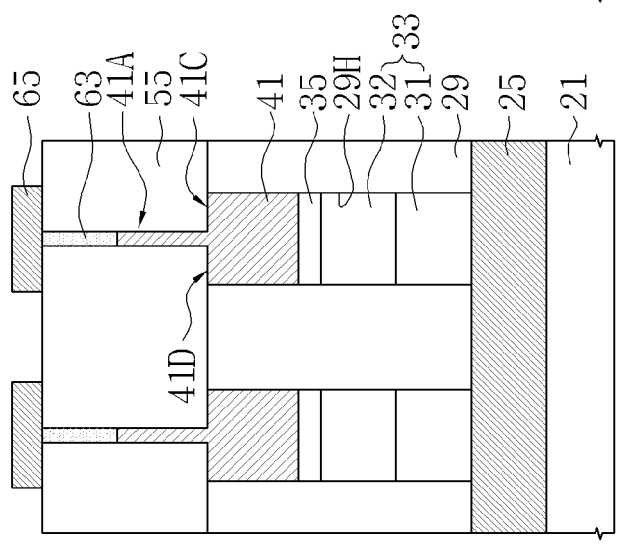
Figure 19C:
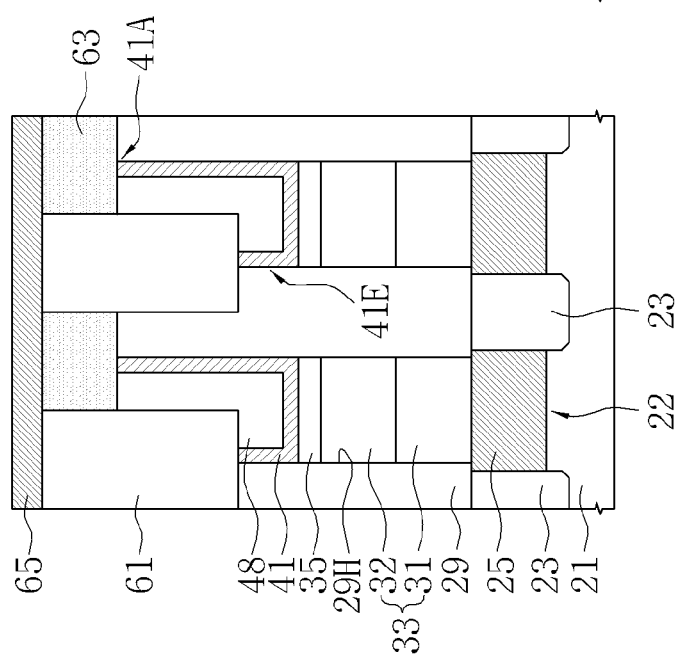

Referring to FIGS. 2 and 9A and 9B, a metal silicide pattern 35 may be formed on the diode 33. The metal silicide pattern 35 may be formed in the contact holes 29H to contact the second semiconductor pattern 32. A top surface of the metal silicide pattern 35 may be formed at a lower level than the top surface of the molding layer 29. Sidewalls of the contact holes 29H may be exposed above the metal silicide pattern 35. The metal silicide pattern 35 may include cobalt silicide (CoSi), nickel silicide (NiSi), tungsten silicide (WSi), titanium silicide (TiSi), or tantalum silicide (TaSi). For example, the metal silicide pattern 35 may include a CoSi layer.

Referring to FIGS. 2 and 10A through 10C, a lower electrode layer 41L may be formed on the metal silicide pattern 35 to cover sidewalls of the contact holes 29H, and may also cover a top surface of the molding layer 29 and the metal silicide pattern in the contact hole 29H. A core layer 48L may be formed on the lower electrode layer 41L. The core layer 34 and the lower electrode layer 41L may be planarized until the molding layer 29 is exposed, thereby forming lower electrodes 41 and core patterns 48. Each of the lower electrodes 41 may have a cup shape or a pipe shape, for example, shown in FIG. 3A. The lower electrode 41 may be self-aligned on the diode 33.

The lower electrodes 41 may contact the metal silicide pattern 35 and cover the sidewalls of the contact holes 29H. The core pattern 48 may completely fill the contact holes 29H. The planarization of the core layer 48L and the lower electrode layer 41L may include a chemical mechanical polishing (CMP) process and/or an etchback process. As a result, top surfaces of the lower electrodes 41, the core patterns 48, and the molding layer 29 may extend along a substantially same plane surface.

The lower electrodes 41 may include titanium nitride (TiN), titanium aluminum nitride (TiAlN), titanium carbon nitride (TiCN), titanium silicon nitride (TiSiN), titanium oxynitride (TiON), tantalum nitride (TaN), tantalum aluminum nitride (TaAlN), tantalum carbon nitride (TaCN), tantalum silicon nitride (TaSiN), C, CN, CoSi, CoSiN, W, WN, WSi, WSiN, Ni, or a combination thereof. The core patterns 48 may include a material having a higher electric resistance than the lower electrodes 41. Also, the core patterns 48 may include a different material from the molding layer 29. For example, the molding layer 29 may include silicon oxide, while the core patterns 48 may include silicon nitride.

Referring to FIGS. 2 and 11A through 11C, a sacrificial pattern 52 may be formed on the molding layer 29. The sacrificial pattern 52 may have a bar shape. The sacrificial pattern 52 may cover a surface of the molding layer 29 between the contact holes 29H and extend across at least a portion of the contact holes 29H. The sacrificial pattern 52 may also at least partially cover the top surfaces of the lower electrodes 41 and the core patterns 48.

The sacrificial pattern 52 may be formed using a thin-film forming process and a patterning process. The patterning process may include a photolithography process. The sacrificial pattern 52 may include a material having an etch selectivity with respect to the core pattern 48 and the molding layer 29. For example, the sacrificial pattern 52 may include a spin-on-hardmask (SOH).

Referring to FIGS. 2 and 12A through 12C, a spacer layer 53L may be formed on the surface of the substrate 21. The spacer layer 53L may cover lateral surfaces of the sacrificial pattern 52 and partially cover the lower electrodes 41 and the core patterns 48. The spacer layer 53L may be anisotropically etched until the lower electrodes 41 are exposed, thereby forming sacrificial spacers 53 on the lateral surfaces of the sacrificial pattern 52.

The sacrificial spacers 53 may be aligned across the centers of the contact holes 29H. The sacrificial patterns 53 may extend in a first direction. Accordingly, the sacrificial spacers 53 may cross the top surfaces of the lower electrodes 41 and the core patterns 48 in the first direction. Each of the lower electrodes 41 may include a first portion 41A corresponding to a first lateral surface of the lower electrode 41 and a second portion 41B corresponding to a second lateral surface of the lower electrode 41 opposite the first portion 41A. At least one of the first and second portions 41A and 41B may be covered with a sacrificial spacer 53.

The sacrificial spacers 53 may include a material having an etch selectivity with respect to the sacrificial pattern 52, the core patterns 48, and the molding layer 29. For example, the sacrificial spacers 53 may include atomic-layer-deposition (ALD) oxide.

A horizontal width of the sacrificial spacers 53 may depend on a deposited thickness of the spacer layer 53L. The ALD oxide obtained using an ALD method enables easy control of a deposition of the spacer layer 53L, thereby establishing the thickness of the spacer layer 53L. Thus, the ALD method can control the thickness of the sacrificial spacers 53 to have a horizontal width that is about 10 nm or less. In an embodiment, the sacrificial spacers 53 are formed having a horizontal width between 1 nm and 10 nm.

Referring to FIGS. 2 and 13A through 13C, the sacrificial pattern 52 may be removed to expose the top surfaces of the molding layer 29, the lower electrodes 41, and the core patterns 48 on both sides of each of the sacrificial spacers 53. Subsequently, first grooves 43G may be formed on both sides of each of the sacrificial spacers 53. The first grooves 43G may be formed by trimming the molding layer 29, the lower electrodes 41, and the core patterns 48, referred to as primary trimming, using the sacrificial patterns 53 as an etch mask. The primary trimming of the molding layer 29, the lower electrodes 41, and the core patterns 48 may include partially removing exposed portions of the core patterns 48. Since the primary trimming process uses the sacrificial spacers 53 extending in the first direction as an etch mask, the primary trimming process may be defined as being performed in the first direction. The primary trimming of the molding layer 29, the lower electrodes 41, and the core patterns 48 may be performed using an anisotropic etching process. As a result, the first and second portions 41A and 41B of the lower electrodes 41 may be retained under the sacrificial spacers 53. Also, the core patterns 48 and the molding layer 29 may be retained under the sacrificial spacers 53.

Third portions 41C of the lower electrodes 41 and fourth portions 41D facing the third portions 41C may be exposed by bottoms of the first grooves 43G. The sacrificial spacers 53, the first portions 41A, the second portions 41B, the core patterns 48, and the molding layer 29 may be exposed by sidewalls of the first grooves 43G. The first and second portions 41A and 41B may be vertically aligned under the sacrificial spacers 53. The first and second portions 41A and 41B may be self-aligned with the sacrificial spacers 53. A horizontal width of the first and second portions 41A and 41B may be substantially the same as the horizontal width of the sacrificial spacers 53. Top surfaces of the first and second portions 41A and 41B may be retained at substantially the same level as the top surfaces of the core patterns 48 and the molding layer 29. The third and fourth portions 41C and 41D of the lower electrodes 41 may be retained having lower levels than top ends of the first and second portions 41A and 41B.

Referring to FIGS. 2 and 14A through 14C, a first insulating layer 55L may be formed to fill the first grooves 43G and cover the sacrificial spacers 53. The first insulating layer 55L may be planarized until the sacrificial spacers 53 are exposed, thereby forming first insulating patterns 55 in the first grooves 43G. The first insulating patterns 55 may include a material having an etch selectivity with respect to the sacrificial spacers 53. For example, the first insulating patterns 55 may include silicon nitride.

Referring to FIGS. 2 and 15A through 15C, a mask pattern 57 may be formed on the sacrificial spacers 53 and the first insulating patterns 55. The mask pattern 57 may cross the sacrificial spacers 53 and the first insulating patterns 55, for example, by extending in a second direction orthogonal to first direction. Accordingly, the mask pattern 57 may cross the sacrificial spacers 53 and the first insulating patterns 55 at right angles. The mask pattern 57 may cover the first portions 41A of the lower electrodes 41. Also, the mask pattern 57 may partially cover the core patterns 48 and the molding layer 29 adjacent to the first portion 41A. The mask pattern 57 may be formed using a photolithography process.

The sacrificial spacers 53, the first insulating patterns 55, the second portions 41B of the lower electrodes 41, the core patterns 48 adjacent to the second portions 41B, and the molding layer 29 adjacent to the second portions 41B may be secondarily trimmed using the mask pattern 57 as an etch mask, thereby forming second grooves 59. Since the second trimming process uses the mask pattern 57 extending in the second direction as an etch mask, the second trimming process may be defined as being performed in the second direction. The secondary trimming of the sacrificial spacers 53, the first insulating patterns 55, the second portions 41B, the core patterns 48, and the molding layer 29 may be performed using an anisotropic etching process. As a result, the second portions 41B of the lower electrodes 41 may be partially removed, forming recessed second portions 41E from the second portions 41B on bottoms of the second grooves 59. The second grooves 59 may intersect the first grooves 43G in right angles.

The sacrificial spacers 53, the first insulating patterns 55, the core patterns 48, and the molding layer 29 may be exposed by sidewalls of the second grooves 59. Bottoms of the second grooves 59 may be formed at a different level from bottoms of the first insulating patterns 55. For example, the bottoms of the second grooves 59 may be formed at lower levels than the bottoms of the first insulating patterns 55. In this case, top ends of the recessed second portions 41E may be formed at lower levels than top ends of the third and fourth portions 41C and 41D. In other embodiments, the bottoms of the second grooves 59 are formed at higher levels than the bottoms of the first insulating patterns 55.

Referring to FIGS. 2 and 16A through 16C, second insulating patterns 61 may be formed to fill the second grooves 59. The formation of the second insulating patterns 61 may be performed using a thin-film forming process and a planarization process. Top surfaces of the second insulating patterns 61, the sacrificial spacers 53, and the first insulating patterns 55 may be exposed on substantially the same plane surface. The second insulating patterns 61 may include a material having an etch selectivity with respect to the sacrificial spacers 53. For example, the second insulating patterns 61 may include silicon nitride.

The mask pattern 57 may be removed during the formation of the second insulating patterns 61. In another embodiment, the mask pattern 57 may be removed before formation of the second insulating patterns 61.

Referring to FIGS. 2 and 17A through 17C, the sacrificial spacers 53 may be removed to form trenches 53H. The first portions 41A of the lower electrodes 41, the core patterns 48 adjacent to the first portions 41A, and the molding layer 29 adjacent to the first portions 41A may be exposed by bottoms of the trenches 53H. Lateral surfaces of the first and second insulating patterns 55 and 61, respectively, may be exposed by sidewalls of the trenches 53H.

Referring to FIGS. 2 and 18A through 18C, data storage plugs 63 may fill the trenches 53H. The formation of the data storage plugs 63 may be performed using a thin-film forming process and a planarization process. The data storage plugs 63 may be self-aligned at the first portions 41A of the lower electrodes 41. At least one lateral surface of the data storage plug 63 may be vertically aligned on one lateral surface of the first portion 41A. Accordingly, a horizontal width of the data storage plug 63 may be substantially equal to the horizontal width of the first portion 41A.

The data storage plugs 63 may include phase-change plugs, polymer plugs, nanoparticle plugs, or resistance-change plugs. For example, the resistance-change plugs may include a strontium titanate ($SrTiO_3$) layer. Also, when the data storage plugs 63 include phase-change plugs, the phase-change plugs may include germanium-antimony-telluride (GeSbTe), germanium-antimony-arsenide (GeTeAs), tin-tellurium-tin (SnTeSn), GeTe, SbTe, selenium-tellurium-tin (SeTeSn), GeTeSe, antimony-selenium-bismuth (SbSeBi), GeBiTe, GeTeTi, indium-selenium (InSe), gallium-tellurium-selenium (GaTeSe), or InSbTe. Furthermore, the phase-change plugs may include a material layer obtained by adding one selected from the group consisting of carbon (C), nitrogen (N), Si, and oxygen (O) to one selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, an InSe layer, a GaTeSe layer, and an InSbTe layer.

Referring back to FIGS. 2 and 19A through 19C, upper electrodes 65 may be formed on the data storage plugs 63. The upper electrodes 65 may cross the word lines 25, and may have a greater width than the data storage plugs 63. The upper electrodes 65 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, or a combination thereof.

Referring again to FIGS. 2 and 3A through 3C, an upper insulating layer 67 may be formed to cover the upper electrodes 65. Bit lines 75 may be formed to penetrate the upper insulating layer 67 and contact the upper electrodes 65. Each of the bit lines 75 may include a barrier metal layer 71, a seed layer 72, and a conductive layer 73 stacked sequentially.

The upper insulating layer 67 may include silicon oxide, silicon nitride, or silicon oxynitride. The barrier metal layer 71 may include Ti, TiN, or Ti/TiN. The seed layer 72 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. The conductive layer 73 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof.

In a method of fabricating a PRAM that depends on a conventional patterning technique, controlling the width of a contact area between a phase-change pattern and a lower electrode to about 15 nm or less may be impossible due to technical limits, such as the resolution limit of a photolithography process. In contrast, in the above-described embodiments of the inventive concept, the width of a contact area between the data storage plug 63 and the lower electrode 41 may depend on the horizontal width of the sacrificial spacers 53. Also, the diameter of the contact hole 29H may depend on the resolution limit of the photolithography process. The horizontal width of the sacrificial spacers 53 may depend on the deposited thickness of the spacer layer 53L. The spacer layer 53L may be formed of an ALD oxide using an ALD method, which can permit the thickness of the spacer layer 53L to be precisely determined Thus, the horizontal width of the first portion 41A of the lower electrode 41 may be controlled to be less than half the diameter of the contact hole 29H. For example, the first portion 41A may be formed to a horizontal width between 1 nm and 10 nm. Furthermore, the horizontal width of the contact area between the data storage plug 63 and the lower electrode 41 may also be controlled to be less than half the diameter of the contact hole 29H. Also, the contact area between the data storage plug 63 and the lower electrode 41 may be formed to a horizontal width between 1 nm and 10 nm. As a result, the contact area between the data storage plug 63 and the lower electrode 41 may be greatly reduced as compared with the conventional case.

FIGS. 20A, 21, 22A, and 23A are cross-sectional views taken along line I-I' of FIG. 2, illustrating a method of fabricating a non-volatile memory device according to other embodiments of the inventive concept. FIGS. 20B, 22B, and 23B are cross-sectional views taken along line II-II' of FIG. 2.

Referring to FIGS. 2 and 20A and 20B, sacrificial spacers 53, first insulating patterns 55, lower electrodes 41, core patterns 48, and a molding layer 29 may be anisotropically etched, thereby forming second grooves 59A. As a result, the lower electrodes 41 may be partially removed so that recessed second portions 41E can be retained on bottoms of the second grooves 59A. The second grooves 59A may intersect the first insulating patterns 55 at right angles.

The sacrificial spacers 53, the first insulating patterns 55, the core patterns 48, and the molding layer 29 may be exposed by sidewalls of the second grooves 59A. Bottoms of the second grooves 59A may be formed at higher levels than bottoms of the first insulating patterns 55. In this case, top ends of the recessed second portions 41E may be formed at higher levels than third and fourth portions 41C and 41D of the lower electrodes 41.

Figure 21:
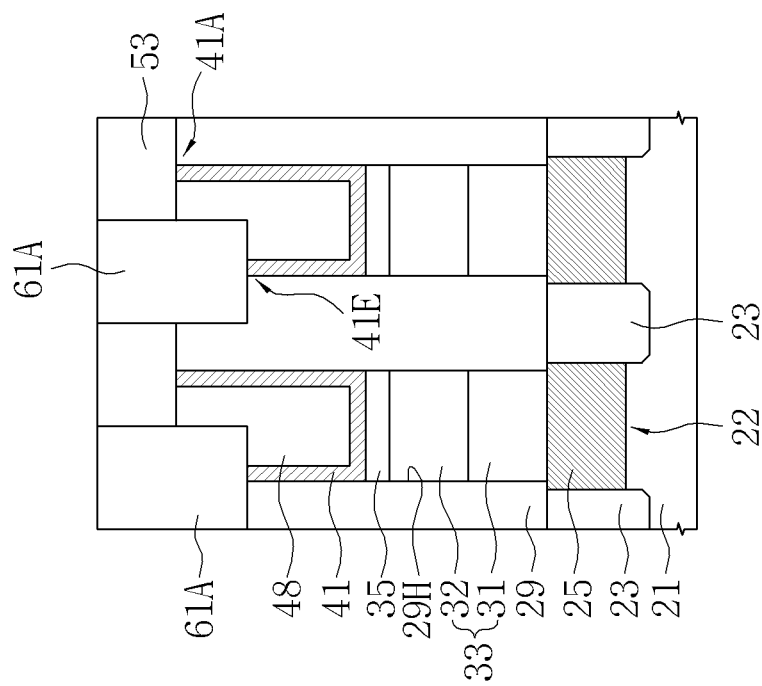

Referring to FIGS. 2 and 21, second insulating patterns 61A may be formed to fill the second grooves 59A. Top surfaces of the second insulating patterns 61A, the sacrificial spacers 53, and the first insulating patterns 55 may be exposed on substantially the same planar surface.

Referring to FIGS. 2 and 22A and 22B, the sacrificial spacers 53 may be removed to form trenches 53H. The first portions 41A of the lower electrodes 41, the core patterns 48 adjacent to the first portions 41A, and the molding layer 29 adjacent to the first portions 41A may be exposed by bottoms of the trenches 53H. Lateral surfaces of the first and second insulating patterns 55 and 61A may be exposed by sidewalls of the trenches 53H.

Subsequently, the first portions 41A of the lower electrodes 41 may be recessed at lower levels than top ends of the core patterns 48 and the molding layer 29. As a result, recess regions 41R may be formed on the first portions 41A of the lower electrodes 41. The recess regions 41R may be formed by etching back the first portions 41A of the lower electrodes 41.

Figure 23A:
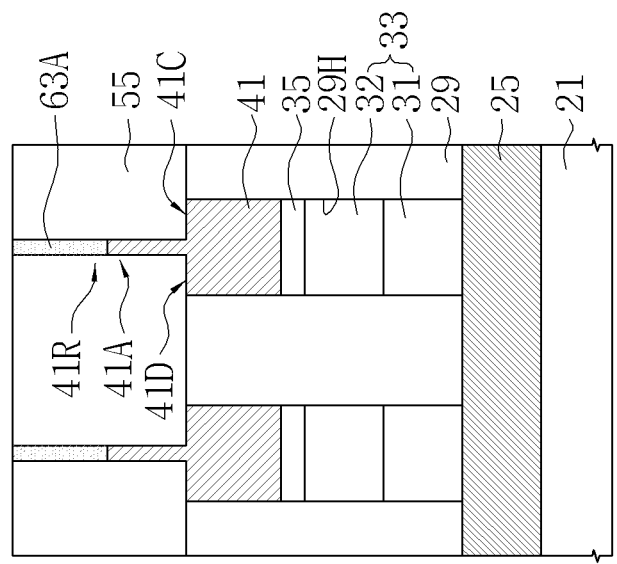
Figure 23B:
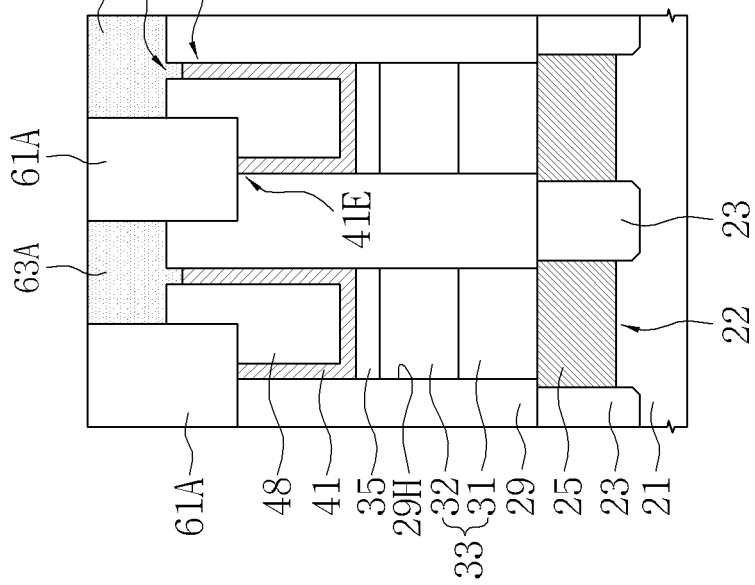

Referring to FIGS. 2 and 23A and 23B, data storage plugs 63A may fill the trenches 53H. The data storage plugs 63A may fill the recess regions 41R and contact the first portions 41A of the lower electrodes 41. The data storage plugs 63A may be self-aligned at the first portions 41A of the lower electrodes 41. At least one lateral surface of the data storage plugs 63A may be vertically aligned on one lateral surface of the first portions 41A of the lower electrodes 41. As shown in FIG. 23A, a lateral surface of bottom portions of the data storage plugs 63A may be in contact with lateral surfaces of the core patterns 48.

Referring back to FIGS. 2 and 5A and 5B, upper electrodes 65 may be formed on the data storage plugs 63A. An upper insulating layer 67 may be formed to cover the upper electrodes 65. Bit lines 75 may be formed to penetrate the upper insulating layer 67 and contact the upper electrodes 65.

Figure 24:
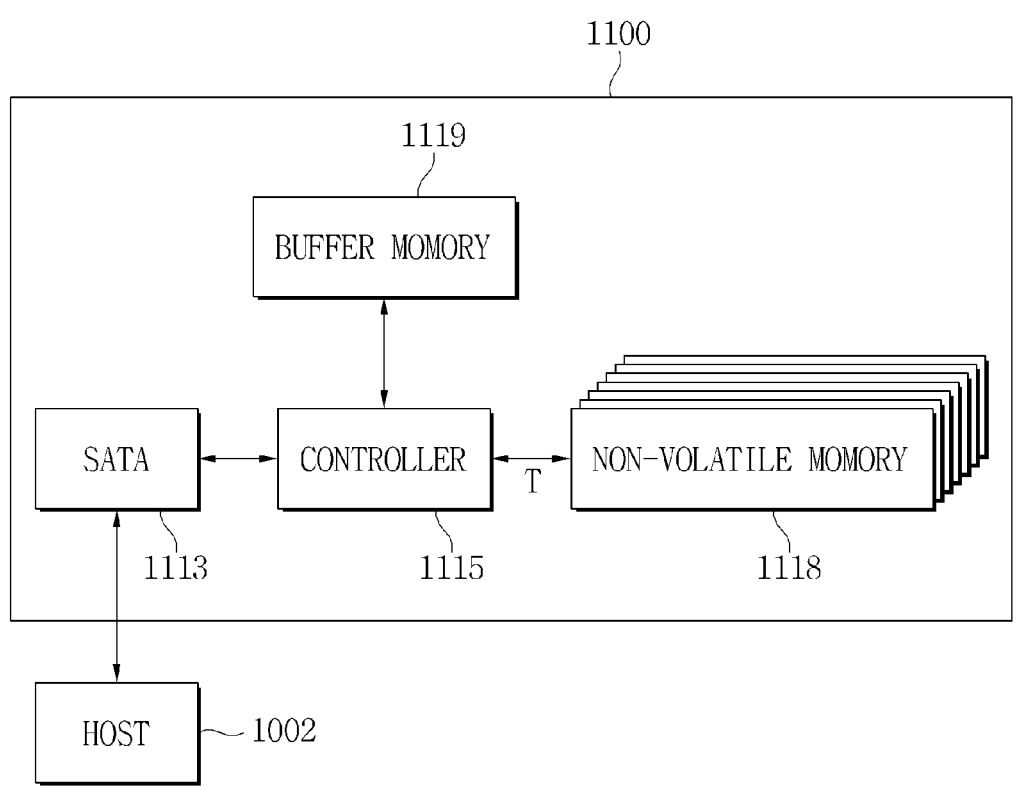
FIG. 24 is a block diagram of an electronic system according to another embodiment of the inventive concepts.

FIG. 24 is a system block diagram of an electronic device according to another embodiment of the inventive concepts.

The electronic device may be a data storage device, for example, a solid-state disk (SSD) 1100.

Referring to FIG. 24, the SSD 1100 may include an interface 1113, a controller 1115, a non-volatile memory 1118, and a buffer memory 1119.

The SSD 1100 may be configured to store information using a semiconductor device. As compared with a hard disk drive (HDD), the SSD 1100 may operate at high speeds, reduce mechanical delay, failure rate, generation of heat, and noise, and be downscaled and made lightweight. The SSD 1100 may be widely used for laptop personal computers (laptop PCs), desktop PCs, MP3 players, or portable storage devices.

The controller 1115 may be formed adjacent to and electrically connected to the interface 1113. The controller 1115 may be a microprocessor (MP) that includes a memory controller and a buffer controller. The non-volatile memory 1118 may be formed adjacent to and electrically connected to the controller 1115. The SSD 1100 may have a data capacity corresponding to the non-volatile memory 1118. The buffer memory 1119 may be formed adjacent to and electrically connected to the controller 1115.

The interface 1113 may be connected to a host 1002 and serve to transmit and receive electric signals, such as data. For example, the interface 1113 may be an apparatus using a standard, such as serial advanced technology attachment (SATA), integrated drive electronics (IDE), small computer system interface (SCSI), and/or a combination thereof. The non-volatile memory 1118 may be connected to the interface 1113 through the controller 1115. The non-volatile memory 1118 may store data received through the interface 1113. Even if power supplied to the SSD 1100 is interrupted, the non-volatile memory 1118 may be characterized by retaining the stored data.

The buffer memory 1119 may include a volatile memory device. The volatile memory device may be a dynamic random access memory (DRAM) and/or a static random access memory (SRAM). The buffer memory 1119 may operate at higher speed than the non-volatile memory device 1118.

Data processing speed of the interface 1113 may be higher than operation speed of the non-volatile memory device 1118. Here, the buffer memory 1119 may function to temporarily store data. After data received through the interface 1113 is temporarily stored in the buffer memory 1119 through the controller 1115, the received data may be permanently stored in the non-volatile memory 1118 at a data write speed of the non-volatile memory 1118. Also, among data stored in the non-volatile memory 1118, frequently used data may be previously read and temporarily stored in the buffer memory 1119. That is, the buffer memory 1119 may function to increase the effective operating speed of the SSD 1100 and reduce an error rate.

The non-volatile memory 1118 may include a non-volatile memory device, which is about the same as described with reference to the devices illustrated at FIGS. 1A through 23B. For example, the non-volatile memory device 1118 may include memory cells, which may have about the same configuration as shown in FIG. 1A. In this case, the non-volatile memory 1118 may exhibit a lower program current than in the conventional case, due to the configurations of the first portion 41A of the lower electrode 41 and the data storage plug 63. Thus, electrical properties of the SSD 1100 may be markedly improved as compared with the conventional case.

Figure 25:
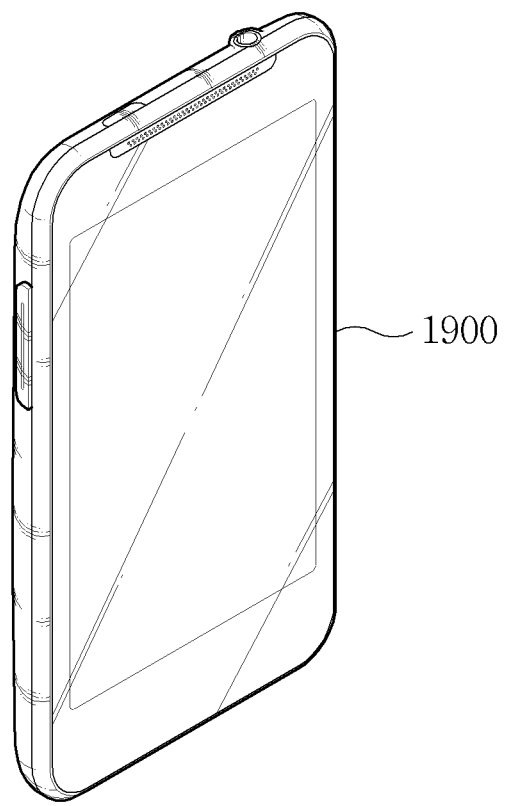
FIGS. 25 and 26 are a perspective view and a block diagram, respectively, of an electronic device according to another embodiment of the inventive concept.
Figure 26:
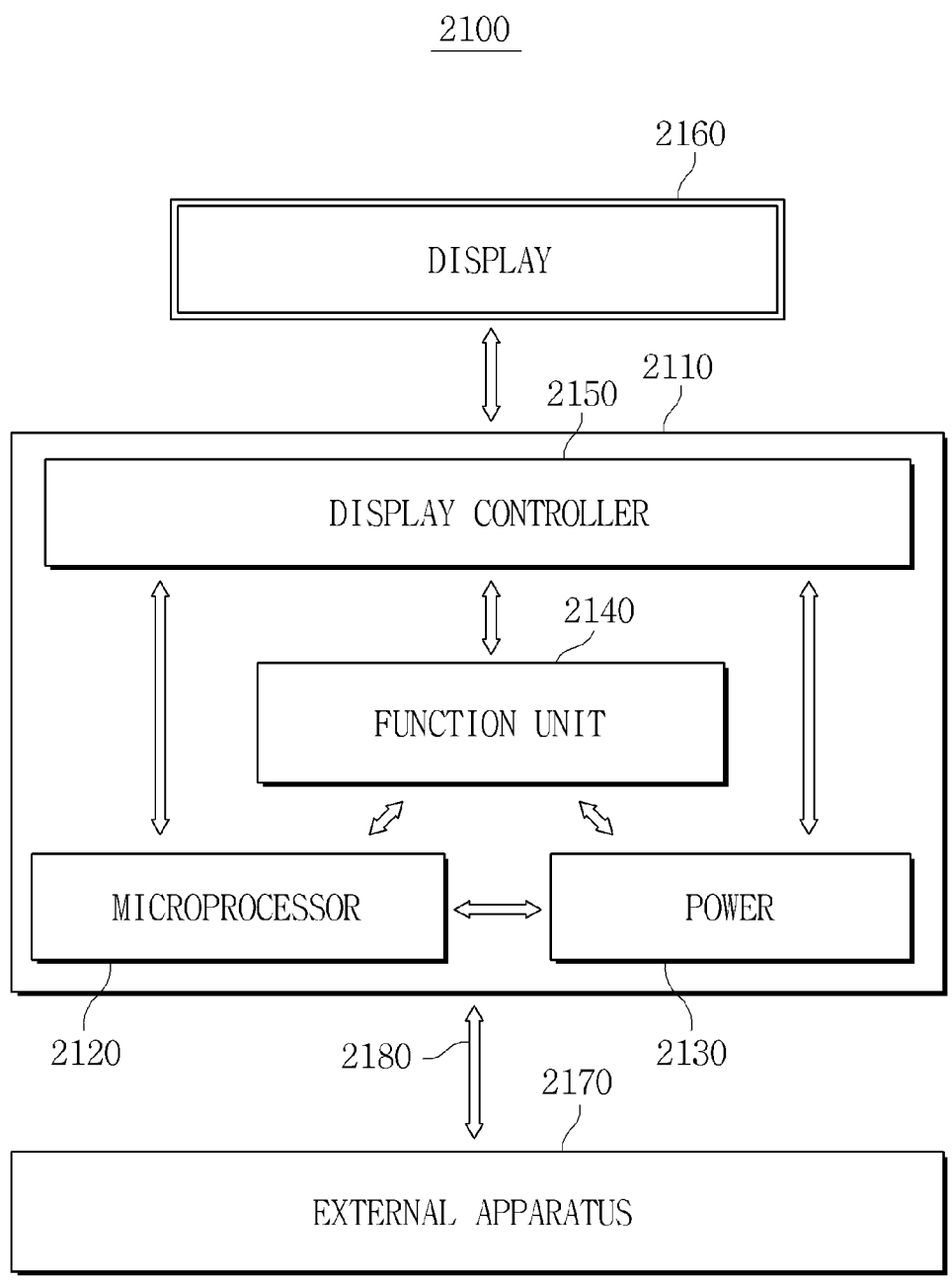

FIGS. 25 and 26 are respectively a perspective view and system block diagram of an electronic device according to another embodiment of the inventive concept.

Referring to FIG. 25, a non-volatile memory device, which is about the same as described with reference to FIGS. 1A through 23B, may be effectively applied to electronic systems, such as a portable phone 1900, a netbook, a laptop computer, or a tablet PC. For instance, the non-volatile memory device, which is about the same as described with reference to FIGS. 1A through 23B, may be mounted on a main board of the portable phone 1900. Furthermore, the non-volatile memory device, which is about the same as those described with reference to FIGS. 1A through 23B, may be provided to an expansion device, such as an external memory card, and combined with the portable phone 1900.

Referring to FIG. 26, the non-volatile memory device, which is about the same as those described with reference to FIGS. 1A through 23A, may be applied to an electronic system 2100. The electronic system 2100 may include a body 2110, an MP unit 2120, a power unit 2130, a function unit 2140, and a display controller unit 2150. The body 2110 may include a mother board including a printed circuit board (PCB). The MP unit 2120, the power unit 2130, the function unit 2140, and the display controller unit 2150 may be mounted on the body 2110. The display unit 2160 may be disposed inside or outside the body 2110. For example, the display unit 2160 may be disposed on the surface of the body 2110 and display an image processed by the display controller unit 2150.

The power unit 2130 may receive a predetermined voltage from an external battery (not shown), divide the voltage into required voltage levels, and supply the divided voltages to the MP unit 2120, the function unit 2140, and the display controller unit 2150. The MP unit 2120 may receive a voltage from the power unit 2130 and control the function unit 2140 and the display unit 2160. The function unit 2140 may serve various functions of the electronic system 2100. For example, when the electronic system 2100 is a portable phone, the function unit 2140 may include several components capable of serving various functions of the portable phone, for example, outputting an image to the display unit 2160 or outputting a voice to a speaker, by dialing or communicating with an external apparatus 2170. When a camera is also mounted, the function unit 2140 may serve as a camera image processor.

In applied embodiments, when the electronic system 2100 is connected to a memory card to increase capacity, the function unit 2140 may be a memory card controller. The function unit 2140 may transmit/receive signals to/from the external apparatus 2170 through a wired or wireless communication unit 2180. Furthermore, when the electronic system 2100 requires a universal serial bus (USB) to increase functionality, the function unit 2140 may serve as an interface controller. In addition, the function unit 2140 may include a mass storage device.

A non-volatile memory device, which is about the same as described with reference to FIGS. 1A through 23B, may be applied to the function unit 2140. For example, the function unit 2140 may include the substrate 21, the lower electrodes 41, the data storage plugs 63, and the upper electrodes 65. The data storage plugs 63 may be electrically connected to the body 2110. In this case, the electronic system 2100 may exhibit a lower program current than in the conventional case, due to the configurations of the first portion 41A of the lower electrode 41 and the data storage plug 63 of the embodiments described herein. Thus, electrical properties of the electronic system 2100 may be markedly improved as compared with the conventional case.

According to embodiments of the inventive concept, a data storage plug contacting a first portion of a lower electrode may be provided. A horizontal width of the first portion of the lower electrode may depend on a horizontal width of a sacrificial spacer. That is, the horizontal width of the first portion may be greatly reduced as compared with the conventional case. As a result, a contact area between the lower electrode and the data storage plug may be greatly reduced as compared with the conventional case. Therefore, a non-volatile memory device that may be driven at a low program current may be embodied.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a non-volatile memory device, comprising:
    forming an electrode on a substrate having a word line;
    forming a sacrificial pattern to partially cover the electrode;
    forming a sacrificial spacer on a lateral surface of the sacrificial pattern, the sacrificial spacer extending across the electrode, the sacrificial spacer having a first side and a second side opposite the first side;
    removing the sacrificial pattern to expose the electrode proximal to the first and second sides of the sacrificial spacer;
    primarily trimming the electrode exposed proximal to the first and second sides of the sacrificial spacer, wherein the electrode is retained under the sacrificial spacer to form a first portion and a second portion facing the first portion;
    secondarily trimming the second portion of the electrode;
    removing the sacrificial spacer to expose the first portion of the electrode; and
    forming a data storage plug on the first portion of the electrode.

2. The method of claim 1, wherein the electrode comprises a pipe-shaped electrode,
    and wherein the forming of the sacrificial spacer comprises:
    forming a spacer layer to cover a top surface of the substrate having the sacrificial pattern; and
    removing the spacer layer until the pipe-shaped electrode is exposed.

3. The method of claim 2, wherein the forming of the spacer layer is performed using an atomic layer deposition (ALD) method.

4. The method of claim 1, further comprising forming a third portion and a fourth portion of the electrode in response to the primary trimming of the electrode, wherein are formed lower than a top end of the first portion, and higher than the second portion.

5. The method of claim 1, wherein at least one lateral surface of the data storage plug is self-aligned with the first portion of the electrode.

6. The method of claim 1, wherein one lateral surface of the data storage plug is vertically aligned with one lateral surface of the first portion of the electrode.

7. The method of claim 1, wherein the first portion of the electrode has substantially the same horizontal width as the data storage plug.

8. The method of claim 1, wherein the electrode comprises a pipe-shaped electrode,
    before forming the sacrificial pattern, further comprising forming a core pattern to fill the inside of the pipe-shaped electrode.

9. The method of claim 8, before forming the data storage plug, further comprising recessing the first portion of the electrode.

10. The method of claim 9, wherein a bottom end of the data storage plug extends lower than a top end of the core pattern.

11. The method of claim 10, wherein the data storage plug contacts a lateral surface of the core pattern.

12. A method of fabricating a non-volatile memory device, comprising:
    forming a molding layer on a substrate;
    forming a plurality of contact holes in the molding layer;
    forming lower electrodes on sidewalls of the contact holes;
    forming a plurality of core patterns, each core pattern filling a contact hole of the contact holes, respectively;
    forming sacrificial spacers that extend across the contact holes and parallel to one another;
    primarily trimming the lower electrodes, the core patterns, and the molding layer in a first direction using the sacrificial spacers as a mask to form a plurality of first grooves, wherein first portions of the lower electrodes and second portions facing the first portions are retained under the sacrificial spacers;
    forming first insulating patterns in the first grooves;
    secondarily trimming the sacrificial spacers, the first insulating patterns, the second portions of the lower electrodes, the core patterns, and the molding layer in a second direction orthogonal to the first direction to form a plurality of second grooves;
    forming second insulating patterns in the second grooves;
    removing the sacrificial spacers to form trenches exposing the first portions of the lower electrodes; and
    forming data storage plugs within the trenches, wherein the data storage plugs are respectively formed between the first insulating patterns and the second insulating patterns.

13. The method of claim 12, wherein a horizontal width of the first portions of the lower electrodes is less than half a diameter of the contact holes.

14. The method of claim 13, wherein the horizontal width of the first portions of the lower electrodes is between 1 nm and 10 nm.

15. The method of claim 12, before forming the lower electrodes, further comprising:
    forming a plurality of diodes in the contact holes; and
    forming metal silicide patterns on the diodes,
    wherein the lower electrodes are self-aligned on the diodes.

16. A method of fabricating a non-volatile memory device, comprising:
    forming a pipe-shaped electrode on a substrate having a word line;
    forming a sacrificial pattern to partially cover the pipe-shaped electrode;
    forming a sacrificial spacer on a lateral surface of the sacrificial pattern, the sacrificial spacer extending across the pipe-shaped electrode, the sacrificial spacer having a first side and a second side opposite the first side;
    removing the sacrificial pattern to expose the pipe-shaped electrode proximal to the first and second sides of the sacrificial spacer;
    primarily trimming the pipe-shaped electrode exposed proximal to the first and second sides of the sacrificial spacer, wherein the pipe-shaped electrode is retained under the sacrificial spacer to form a first portion and a second portion facing the first portion;

secondarily trimming the second portion of the pipe-shaped electrode;

removing the sacrificial spacer to expose the first portion of the pipe-shaped electrode; and forming a data storage plug on the first portion of the pipe-shaped electrode.

* * * * *